(12) United States Patent
Choi et al.

(10) Patent No.: US 11,227,973 B2
(45) Date of Patent: Jan. 18, 2022

(54) SEMICONDUCTOR DEVICE

(71) Applicant: SUZHOU LEKIN SEMICONDUCTOR CO., LTD., Taicang (CN)

(72) Inventors: Rak Jun Choi, Seoul (KR); Byeoung Jo Kim, Seoul (KR)

(73) Assignee: SUZHOU LEKIN SEMICONDUCTOR CO., LTD., Suzhou (CN)

( * ) Notice: Subject to any disclaimer, the term of this patent is extended or adjusted under 35 U.S.C. 154(b) by 62 days.

(21) Appl. No.: 16/766,172

(22) PCT Filed: Nov. 26, 2018

(86) PCT No.: PCT/KR2018/014636
§ 371 (c)(1),
(2) Date: May 21, 2020

(87) PCT Pub. No.: WO2019/103556
PCT Pub. Date: May 31, 2019

(65) Prior Publication Data
US 2020/0287076 A1    Sep. 10, 2020

(30) Foreign Application Priority Data
Nov. 24, 2017   (KR) .................. 10-2017-0158948

(51) Int. Cl.
*H01L 33/02*      (2010.01)
*H01L 33/22*      (2010.01)
(Continued)

(52) U.S. Cl.
CPC ............ *H01L 33/025* (2013.01); *H01L 33/22* (2013.01); *H01L 33/382* (2013.01); *H01L 33/46* (2013.01)

(58) Field of Classification Search
CPC ..... H01L 33/025; H01L 33/382; H01L 33/36; H01L 33/387
See application file for complete search history.

(56) References Cited

U.S. PATENT DOCUMENTS 11,075,321 B2 * 7/2021 Kim ...................... H01L 33/36
2011/0204403 A1   8/2011 Kim et al.
(Continued)

FOREIGN PATENT DOCUMENTS

JP    2008-160025    7/2008
KR    10-2012-0003774    1/2012
(Continued)

OTHER PUBLICATIONS

International Search Report dated Feb. 28, 2019 issued in Application No. PCT/KR2018/014636.

*Primary Examiner* — Savitri Mulpuri
(74) *Attorney, Agent, or Firm* — Birch, Stewart, Kolasch & Birch, LLP

(57) ABSTRACT

Disclosed according to an embodiment is a semiconductor device comprising: a semiconductor structure including a first conductive semiconductor layer, a second conductive semiconductor layer, and an active layer disposed between the first conductive semiconductor layer and the second conductive semiconductor layer; a first electrode electrically connected to the first conductive semiconductor layer; and a second electrode electrically connected to the second conductive semiconductor layer, wherein the semiconductor structure includes a third conductive semiconductor layer disposed between the second conductive semiconductor layer and the second electrode, the first conductive semiconductor layer includes a first dopant, the second conductive semiconductor layer includes a second dopant, the third conductive semiconductor layer includes the first dopant and the second dopant, and the concentration ratio between the (Continued)

first dopant and the second dopant included in the third conductive semiconductor layer ranges from 0.01:1.0 to 0.8:1.0.

14 Claims, 13 Drawing Sheets

(51) Int. Cl.
*H01L 33/38* (2010.01)
*H01L 33/46* (2010.01)

(56) References Cited

U.S. PATENT DOCUMENTS

| | | |
|---|---|---|
| 2012/0001196 A1 | 1/2012 | Choi et al. |
| 2016/0111595 A1* | 4/2016 | Lee ........................ H01L 33/06 257/13 |

FOREIGN PATENT DOCUMENTS

| | | |
|---|---|---|
| KR | 10-2012-0111364 | 10/2012 |
| KR | 10-2016-0084992 | 7/2016 |

* cited by examiner

【FIG. 1】
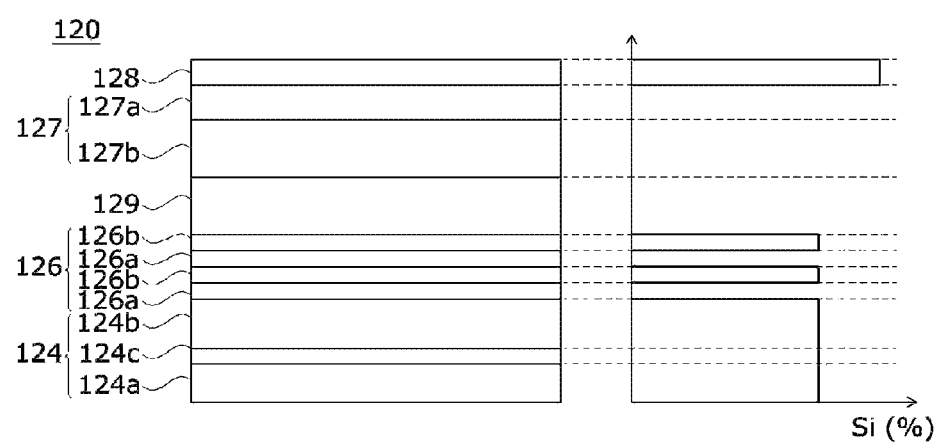

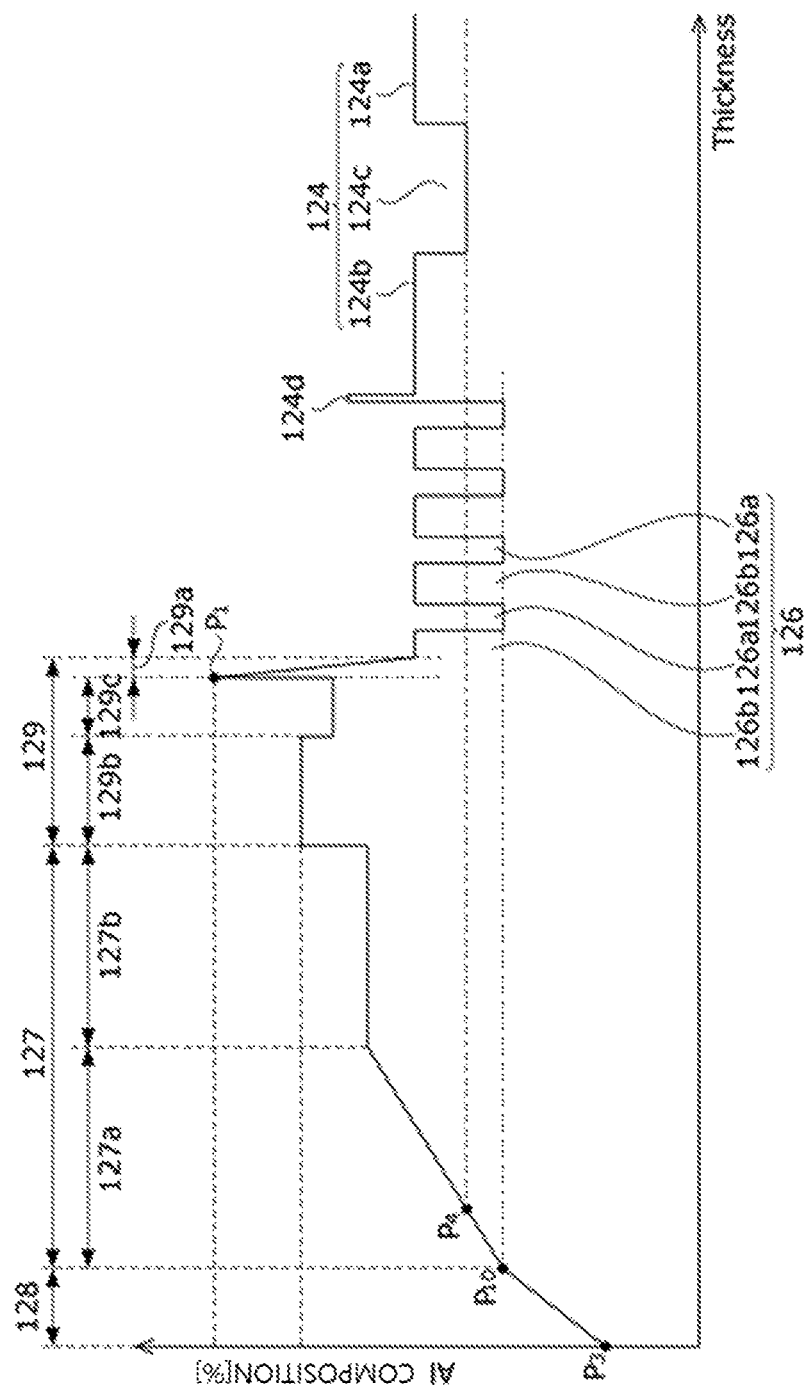

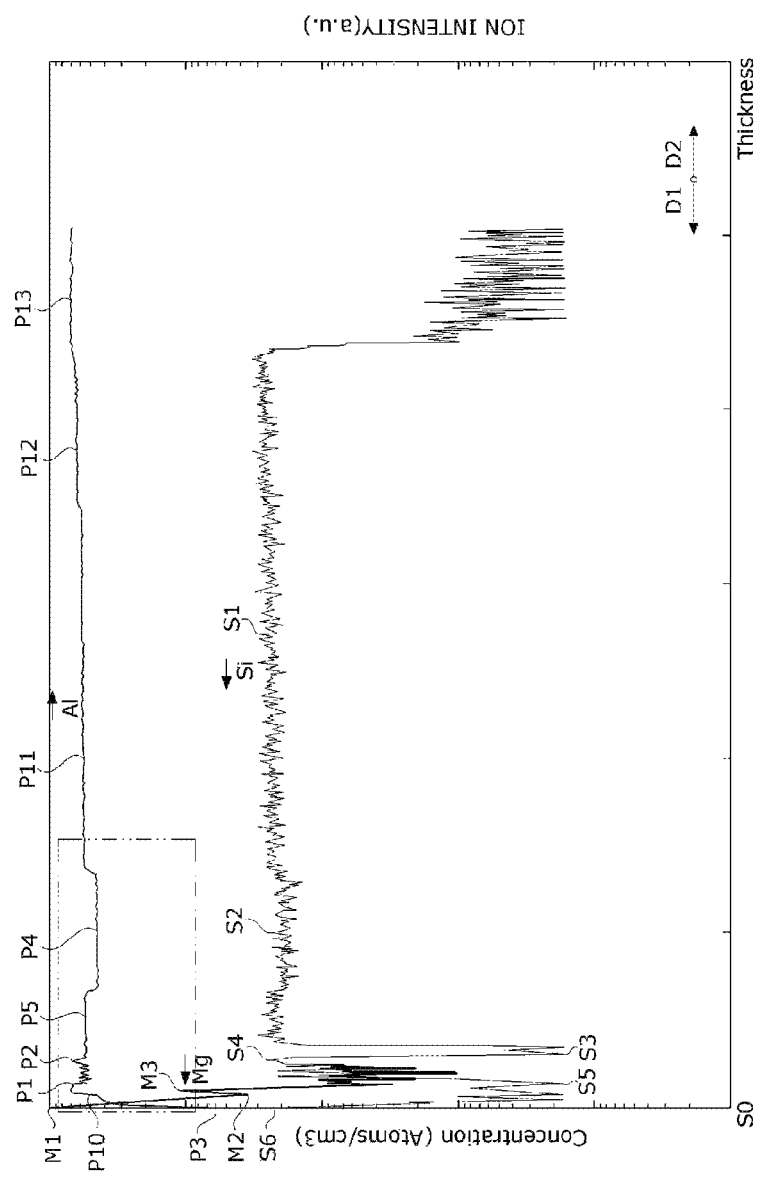
[FIG. 2B]

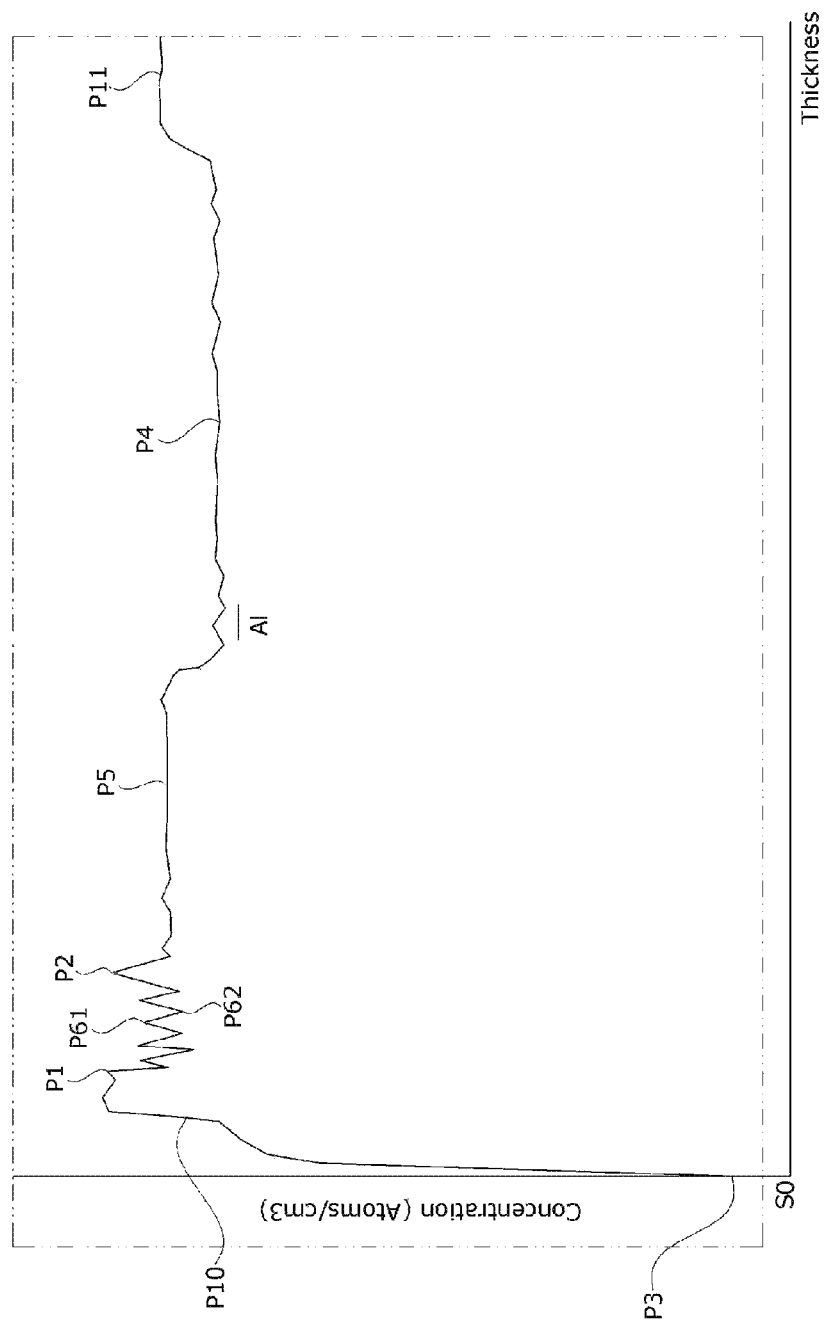

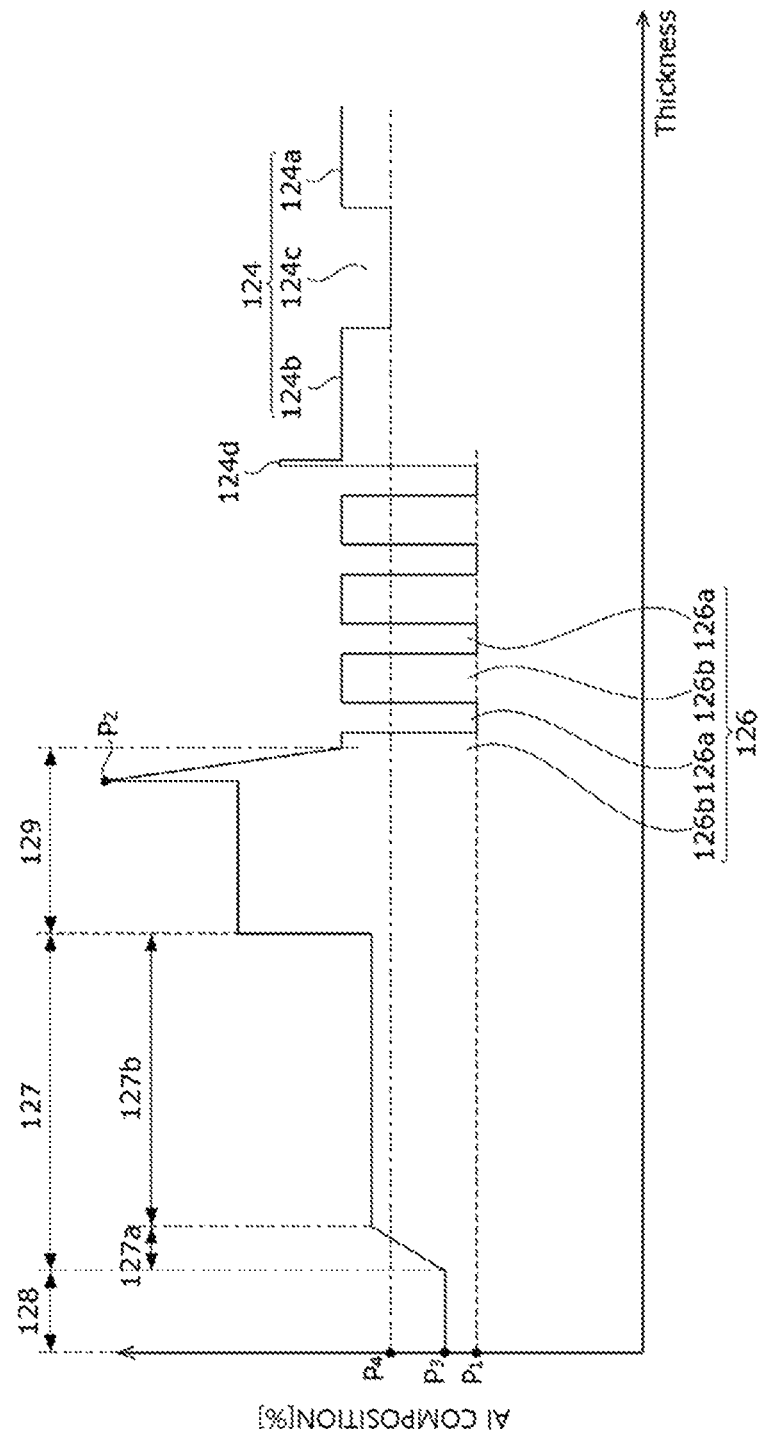

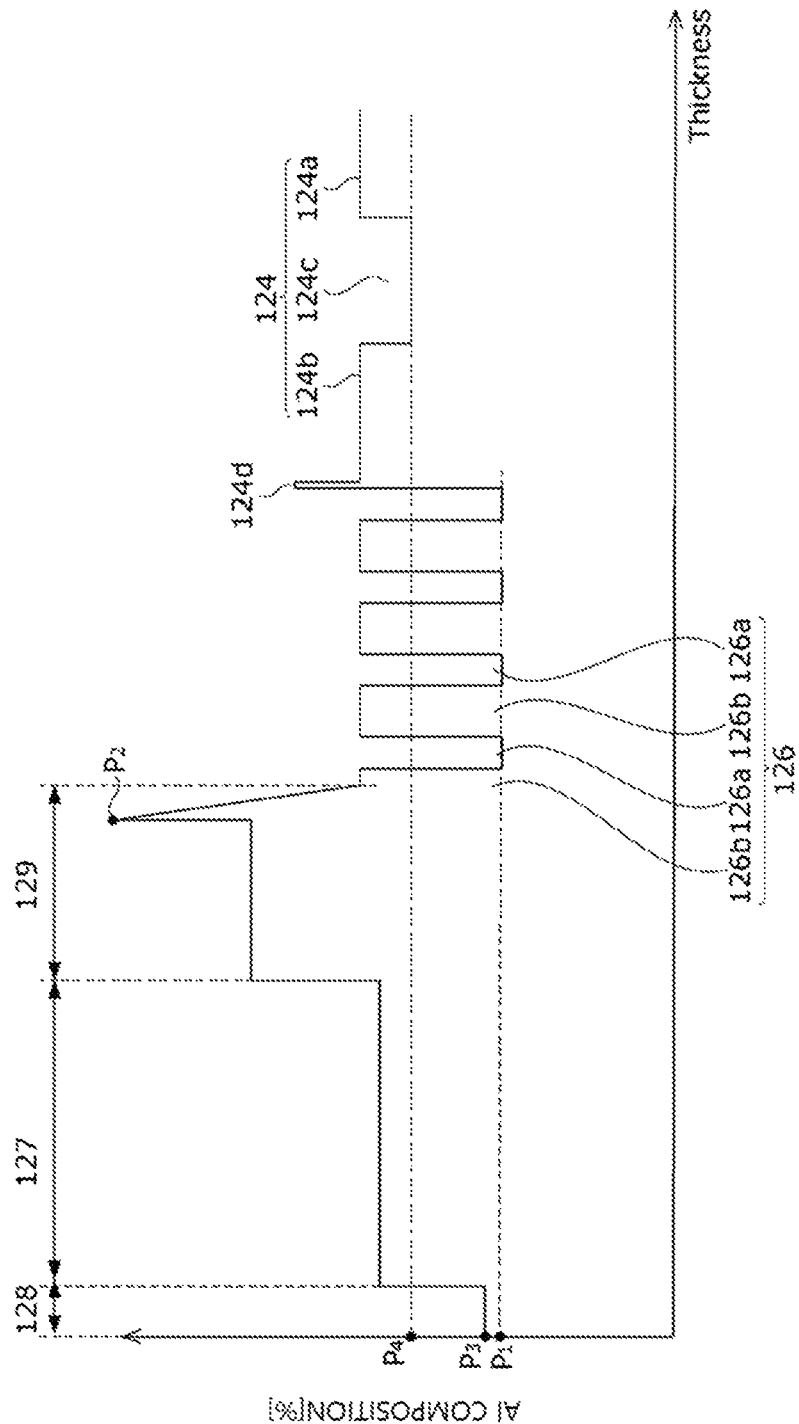
[FIG. 4]

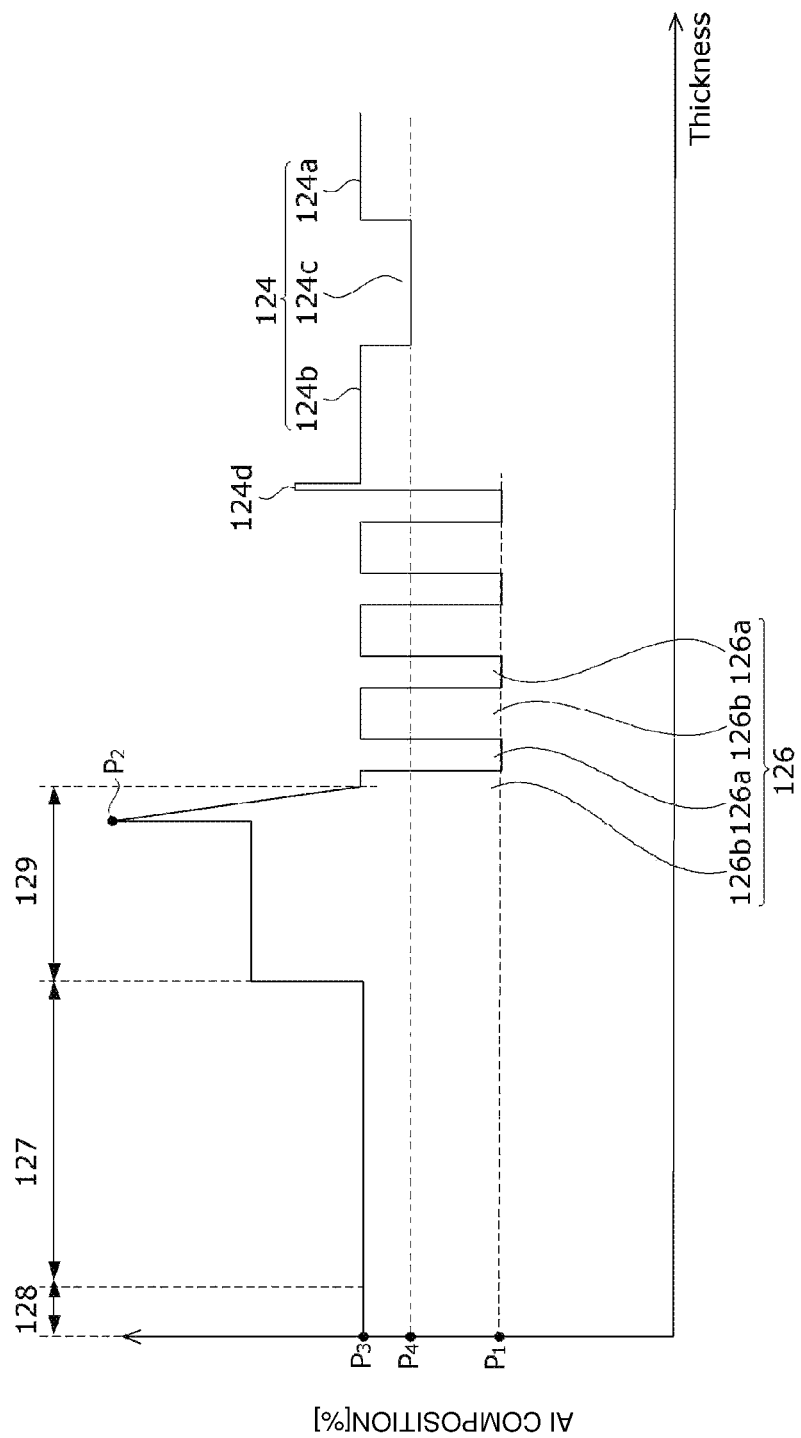
[FIG. 5]

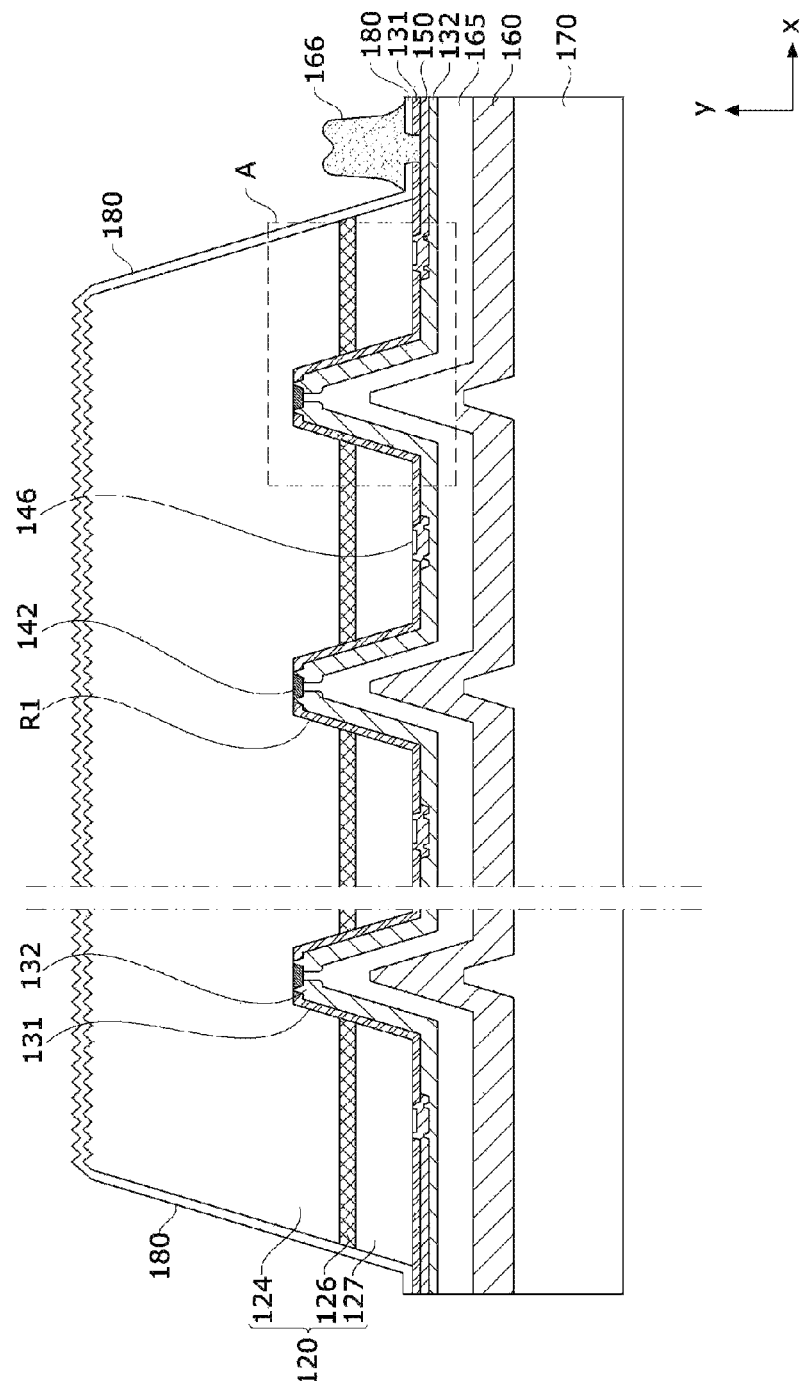
[FIG. 6]

[FIG. 7A]
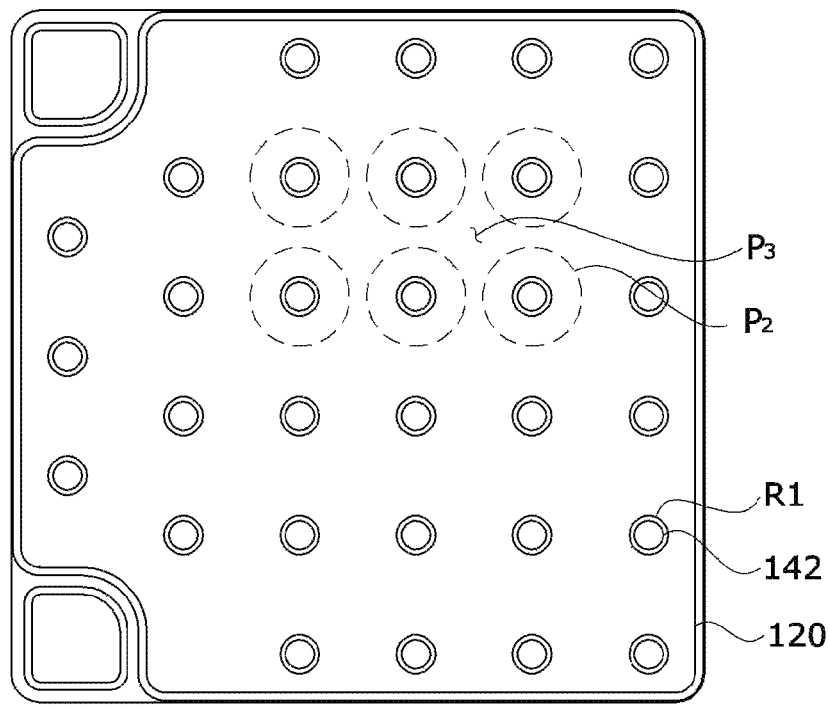
[FIG. 7B]
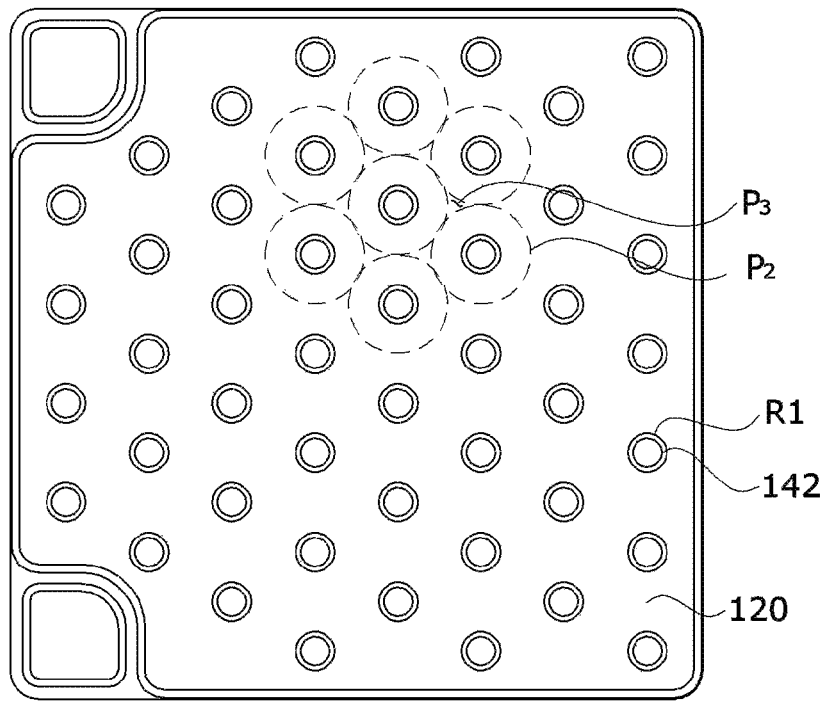

[FIG. 8]
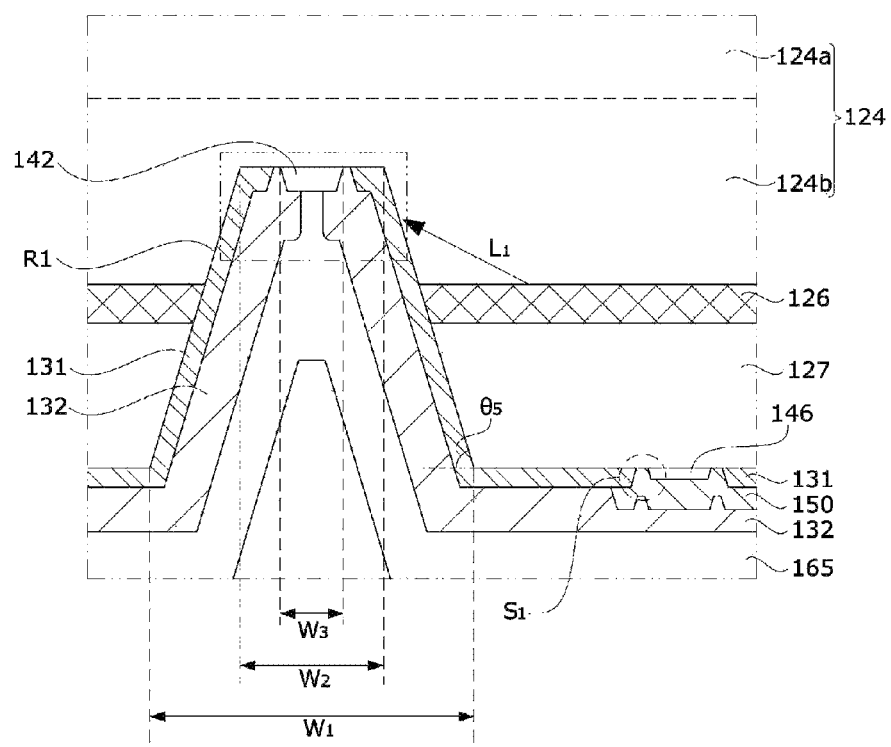

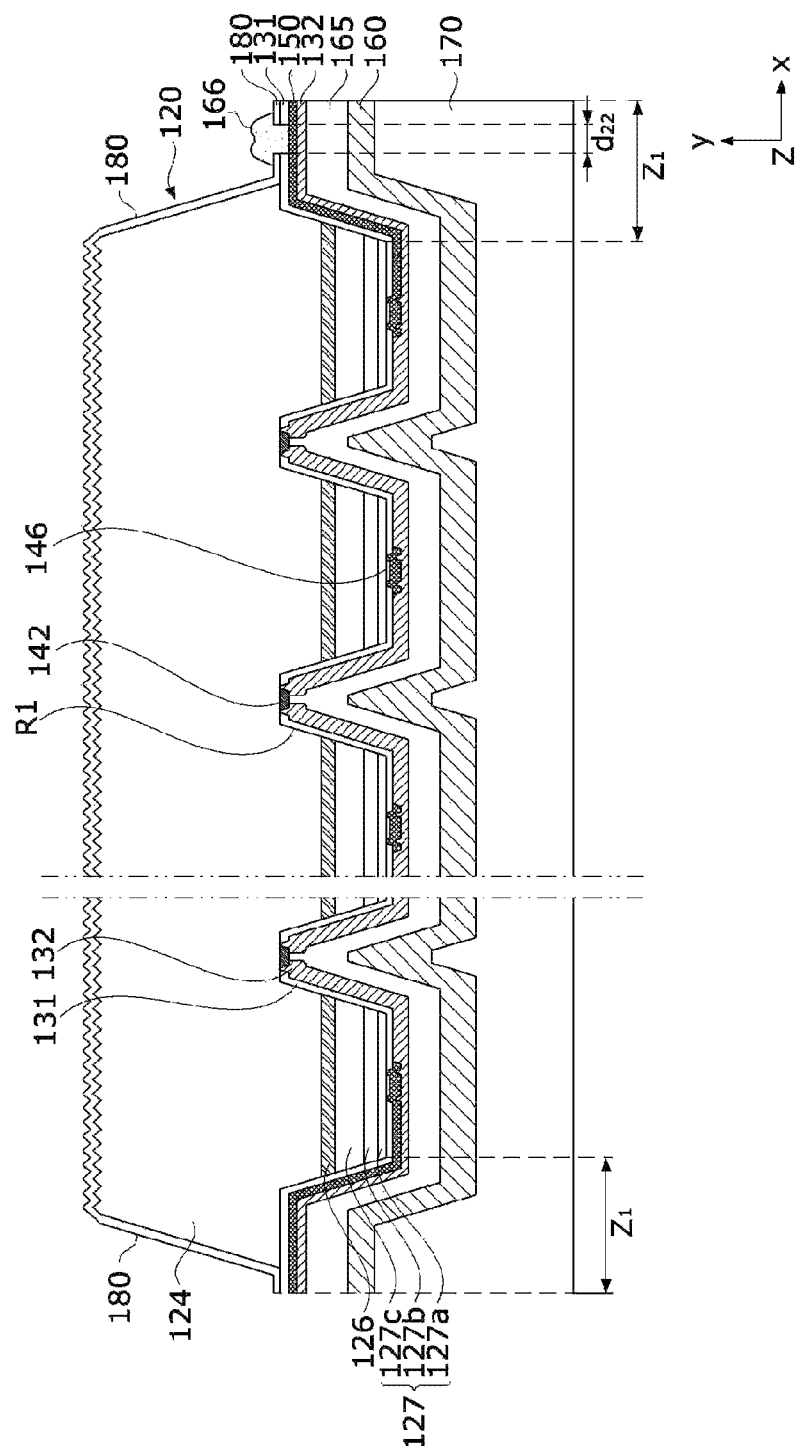
[FIG. 9]

【FIG. 10】
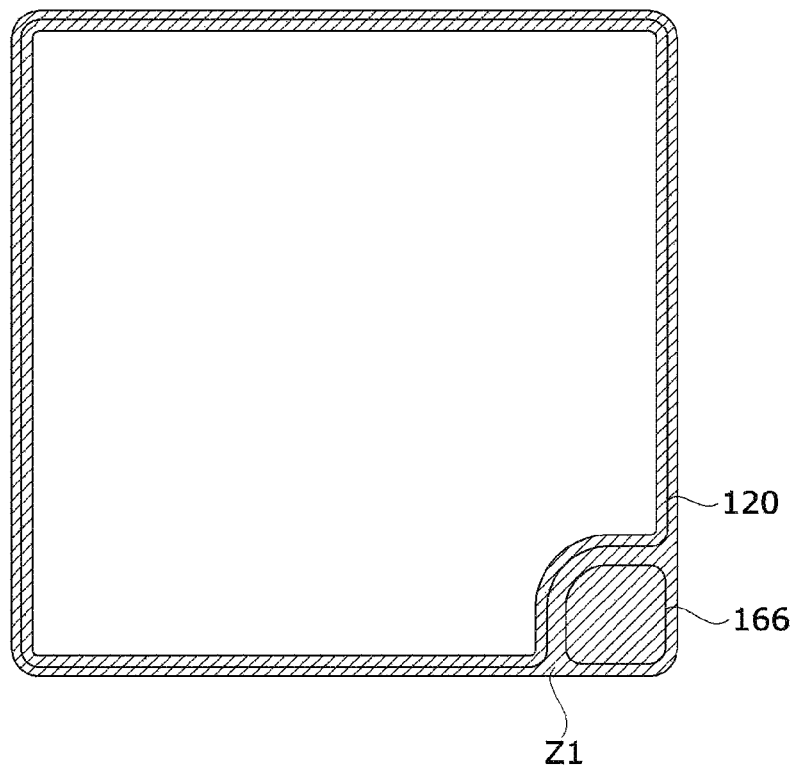
【FIG. 11】
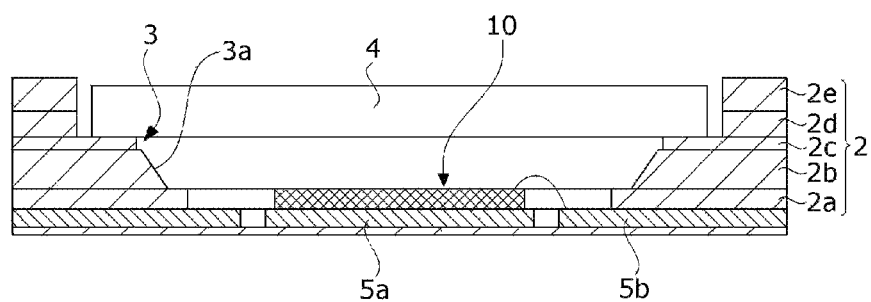

[FIG. 12]
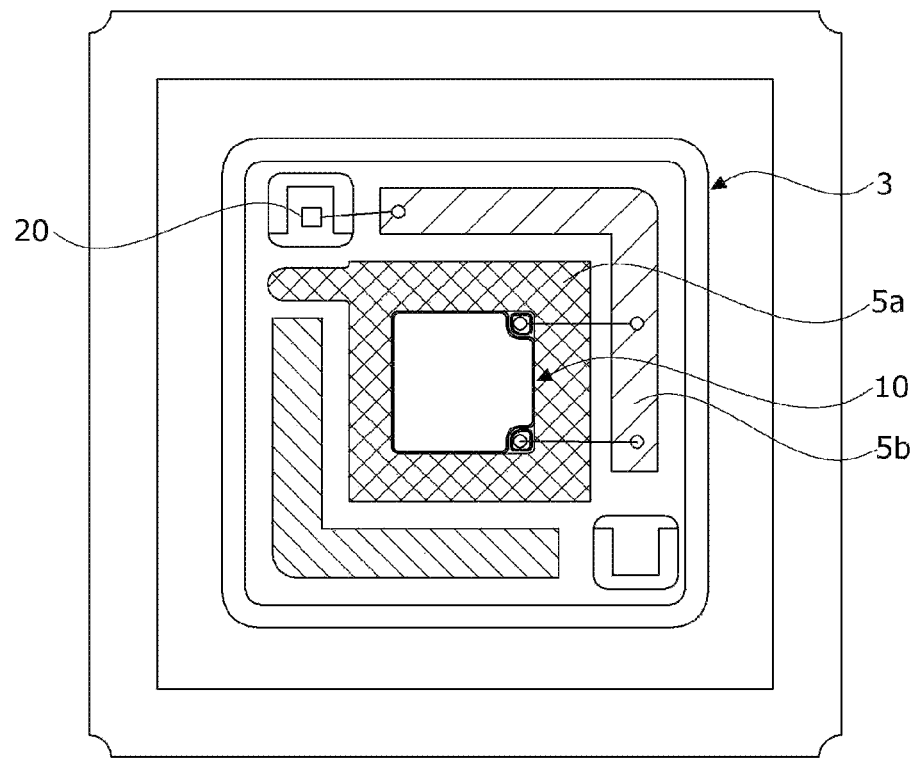
[FIG. 13]
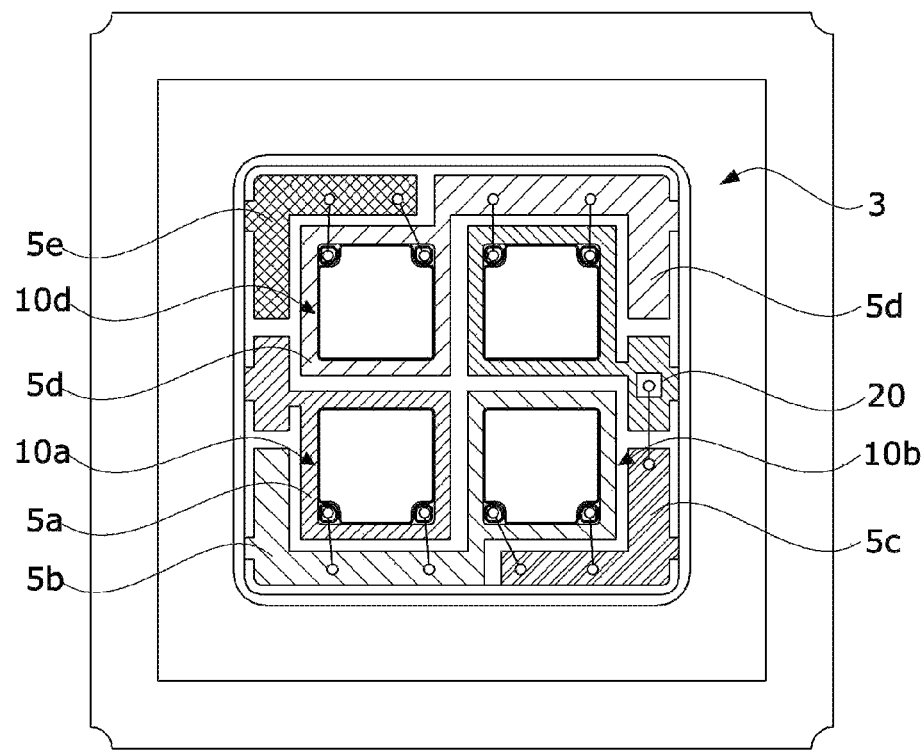

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2018/014636, filed Nov. 26, 2018, which claims priority to Korean Patent Application No. 10-2017-0158948, filed Nov. 24, 2017, whose entire disclosures are hereby incorporated by reference.

TECHNICAL FIELD

Embodiments relate to semiconductor devices.

BACKGROUND ART

Semiconductor devices, which include compounds such as GaN and AlGaN, have many advantages, e.g., wide and easily controllable bandgap energy, and thus may be variously used in light-emitting elements, light-receiving elements, various diodes, and the like.

Particularly, light-emitting elements, such as a light-emitting diode or a laser diode using a Group III-V or Group II-VI compound semiconductor material of a semiconductor, are capable of not only emitting various color rays, such as red, green, blue, and ultraviolet rays, owing to development of thin-film growth technology and element materials but also emitting high-efficient white light beams using fluorescent materials or combination of colors, and have advantages such as low power consumption, a semi-permanent lifetime, a quick response rate, safety, and environmental friendliness, compared to existing light sources such as fluorescent lamps and incandescent lamps.

Furthermore, when a light-receiving element such as a photodetector or a solar cell is manufactured using a Group III-V or Group II-VI compound semiconductor material of a semiconductor, photocurrent may be generated by absorbing light in various wavelength regions due to development of device materials so that light in various wavelength ranges ranging from gamma rays to radio wavelength regions may be used. In addition, semiconductor devices have advantages, e.g., a quick response rate, safety, environmental friendliness, and easy controllability of device materials and thus are easily applicable to power control or microwave circuits or communication modules.

Accordingly, applications of semiconductor devices have been expanded to a transmission module of an optical communication unit, a light-emitting diode backlight unit which may replace a cold cathode fluorescent lamp (CCFL) of a backlight unit of a liquid crystal display (LCD) device, a white light-emitting diode illumination device which may replace a fluorescent lamp or an incandescent lamp, headlights for vehicles, traffic lights, sensors for sensing gas and fire, and the like. In addition, applications of semiconductor devices may be expanded to high-frequency application circuits, other power control devices, and communication modules.

Particularly, light-emitting elements that emit light in an ultraviolet wavelength region may be used for curing, medical, and sterilization purposes by curing or sterilizing.

Recently, research has been actively conducted on ultraviolet light-emitting elements but vertical ultraviolet light-emitting elements are difficult to manufacture and the intensity of output light decreases when a GaN thin-film is used for ohmic characteristics.

DISCLOSURE

Technical Problem

Embodiments provide a semiconductor device having improved ohmic characteristics.

Embodiments provide a semiconductor device having an improved light output.

Embodiments provide a vertical ultraviolet light-emitting element.

Aspects of embodiments are not limited thereto and should be understood to include objects or effects that can be figured out from the technical solution or modes of the invention described below.

Technical Solution

A semiconductor device according to an embodiment of the present invention includes a semiconductor structure including a first conductive semiconductor layer, a second conductive semiconductor layer, and an active layer between the first conductive semiconductor layer and the second conductive semiconductor layer; a first electrode electrically connected to the first conductive semiconductor layer; and a second electrode electrically connected to the second conductive semiconductor layer, wherein the semiconductor structure further includes a third conductive semiconductor layer between the second conductive semiconductor layer and the second electrode, the first conductive semiconductor layer includes a first dopant, the second conductive semiconductor layer includes a second dopant, the third conductive semiconductor layer includes the first dopant and the second dopant, and a concentration ratio between the first dopant and the second dopant which are doped on the third conductive semiconductor layer is in a range of 0.01:1.0 to 0.8:1.0.

Advantageous Effects

According to embodiments, ohmic characteristics can be improved to decrease an operating voltage.

Furthermore, light absorption can be suppressed in a semiconductor device to improve light output.

Various and beneficial advantages and effects of the present invention are not limited thereto and will be more easily understood in the course of describing embodiments of the present invention in detail.

DESCRIPTION OF DRAWINGS

FIG. 1 is a conceptual diagram of a semiconductor structure according to a first embodiment of the present invention.

FIG. 2A is a graph showing an aluminum composition ratio of the semiconductor structure according to the first embodiment of the present invention.

FIG. 2B illustrates secondary ion mass spectrometry (SIMS) data of the semiconductor structure according to the first embodiment of the present invention.

FIG. 2C is a graph showing the strength of aluminum ions.

FIG. 3 is a graph showing an aluminum composition ratio of a semiconductor structure according to a second embodiment of the present invention.

FIG. 4 is a graph showing an aluminum composition ratio of a semiconductor structure according to a third embodiment of the present invention.

FIG. 5 is a graph showing an aluminum composition ratio of a semiconductor structure according to a fourth embodiment of the present invention.

FIG. 6 is a conceptual diagram of a semiconductor device according to an embodiment of the present invention.

FIGS. 7A and 7B are diagrams for describing a configuration in which light output is improved according to the number of recesses.

FIG. 8 is an enlarged view of part A of FIG. 6.

FIG. 9 is a conceptual diagram of a semiconductor device according to another embodiment of the present invention.

FIG. 10 is a plan view of FIG. 9.

FIG. 11 is a conceptual diagram of a semiconductor device package according to an embodiment of the present invention.

FIG. 12 is a plan view of a semiconductor device according to an embodiment of the present invention.

FIG. 13 is a modified example of FIG. 12.

MODES OF THE INVENTION

Embodiments set forth herein may be embodied in many different forms or implemented in various combinations, and the scope of the present invention is not limited to the embodiments described below.

Although matters described in a certain embodiment are not described in another embodiment, the matters may be understood in relation to the other embodiment unless described otherwise or contradictory to the matters.

For example, when features of a configuration A are described in a certain embodiment and features of a configuration B are described in another embodiment, it is to be understood that they fall within the scope of the present invention unless described otherwise or contradictory to the description, even when an embodiment in which the configuration A and the configuration B are combined is not explicitly described.

When one element is referred to as being formed "on" or "under" another element in embodiments, it will be understood that the two elements are formed to be in direct contact with each other or to be in indirect contact with each other with one or more elements therebetween. The expression "on or under" one element should be understood to mean not only an upward direction but also a downward direction with respect to the element.

Hereinafter, embodiments of the present invention will be described in detail with reference to the accompanying drawings so that they may be easily implemented by those of ordinary skill in the technical field to which the present invention pertains.

FIG. 1 is a conceptual diagram of a semiconductor structure according to an embodiment of the present invention. FIG. 2A is a graph showing an aluminum composition ratio of a semiconductor structure according to an embodiment of the present invention. FIG. 2B illustrates secondary ion mass spectrometry (SIMS) data of a semiconductor structure according to an embodiment of the present invention.

Referring to FIGS. 1 and 2A, the semiconductor device according to the embodiment includes a semiconductor structure 120 which includes a first conductive semiconductor layer 124, a second conductive semiconductor layer 127, and an active layer 126 between the first conductive semiconductor layer 124 and the second conductive semiconductor layer 127.

The semiconductor structure 120 according to the embodiment of the present invention may output light in an ultraviolet wavelength range. For example, the semiconductor structure 120 may output light (UV-A) in a near-ultraviolet wavelength range, light (UV-B) in a far-ultraviolet wavelength range, and light (UV-C) in a deep-ultraviolet wavelength range. A wavelength range may be determined by an aluminum composition ratio of the semiconductor structure 120.

For example, the light (UV-A) in the near-ultraviolet wavelength range may have a wavelength of 320 nm to 420 nm, the light (UV-B) in the far-ultraviolet wavelength range may have a wavelength of 280 nm to 320 nm, and the light (UV-C) of the deep-ultraviolet wavelength range may have a wavelength of 100 nm to 280 nm.

When the semiconductor structure 120 emits light in the ultraviolet wavelength range, each semiconductor layer of the semiconductor structure 120 includes an $In_{x1}Al_{y1}Ga_{1-x1-y1}N$ material containing aluminum (here, $0 \leq x1 \leq 1$, $0 < y1 \leq 1$, $0 \leq x1+y1 \leq 1$). Here, the composition of Al may be represented by a ratio of the atomic weight of Al to a total atomic weight including the atomic weight of In, the atomic weight of Ga, and the atomic weight of Al. For example, when the composition of Al is 40%, the composition of Ga may be 60%, and such a composition ratio may be represented by Al40Ga60N.

In a description of embodiments, a low composition or a high composition may be understood to mean the difference (% point) between compositions (%) of respective semiconductor layers. For example, when an aluminum composition in a first semiconductor layer is 30% and an aluminum composition in a second semiconductor layer is 60%, it may be described that the aluminum composition in the second semiconductor layer is 30% higher than that in the first semiconductor layer.

The first conductive semiconductor layer 124 may be a Group III-V compound semiconductor or a Group II-VI compound semiconductor and may be doped with a first dopant. The first conductive semiconductor layer 124 may be selected from among semiconductor materials having an empirical formula of $In_{x1}Al_{y1}Ga_{1-x1-y1}N$ (here, $0 < x1 < 1$, $0 < y1 \leq 1$, $0 \leq x1+y1 \leq 1$), e.g., GaN, AlGaN, InGaN, or InAlGaN. The first dopant may be an n-type dopant such as Si, Ge, Sn, Se, or Te. When the first dopant is an n-type dopant, the first conductive semiconductor layer 124 doped with the first dopant may be an n-type semiconductor layer.

The first conductive semiconductor layer 124 may include a first-first conductive semiconductor layer 124a, a first-second conductive semiconductor layer 124b, and an intermediate layer 124c between the first-first conductive semiconductor layer 124a and the first-second conductive semiconductor layers 124b.

The first-second conductive semiconductor layer 124b may be disposed closer to the active layer 126 than the first-first conductive semiconductor layer 124a. An aluminum composition in the first-second conductive semiconductor layer 124b may be the same as or lower than that in the first-first conductive semiconductor layer 124a.

When the semiconductor structure 120 emits light (UV-C) in the deep-ultraviolet wavelength range, the aluminum composition in the first-second conductive semiconductor layer 124b may be in a range of 40% to 70%, and the aluminum composition in the first-first conductive semiconductor layer 124a may be in a range of 50% to 80%. When the aluminum composition in the first-second conductive semiconductor layer 124b is 40% or more, light extraction efficiency may be improved by lowering an absorption rate of light (UV-C) in the deep-ultraviolet wavelength range emitted from the active layer 126. When the aluminum composition in the first-second conductive semiconductor layer 124b is 70% or less, a rate of injection of a current into the active layer 126 and a current diffusion rate in the first-second conductive semiconductor layer 124b may be secured.

When the aluminum composition in the first-first conductive semiconductor layer 1241 is 50% or more, light extraction efficiency may be improved by lowering an absorption rate of light (UV-C) in the deep-ultraviolet wavelength range emitted from the active layer 126. When the aluminum composition in the first-first conductive semiconductor layer 1241 is 80% or less, a feature of injection of a current into the active layer 126 and a feature of diffusing a current in the first-first conductive semiconductor layer 124a may be secured.

The aluminum composition in the first-first conductive semiconductor layer 124a may be higher than that in the first-second conductive semiconductor layer 124b. In this case, light may be more likely to be extracted from the active layer 126 to the outside of the semiconductor structure 120 due to a refractive index difference and thus light extraction efficiency of the semiconductor structure 120 may be improved.

A thickness of the first-second conductive semiconductor layer 124b may be less than that of the first-first conductive semiconductor layer 124a. The thickness of the first-first conductive semiconductor layer 124a may be greater by 130% or more than that of the first-second conductive semiconductor layer 124b. According to this configuration, the intermediate layer 124c is disposed after securing a sufficient thickness of the first-first conductive semiconductor layer 124a having a high aluminum composition and thus crystallinity of the entire semiconductor structure 120 may be improved.

The aluminum composition in the intermediate layer 124c may be lower than those of the first conductive semiconductor layer 124 and the second conductive semiconductor layer 127. The intermediate layer 124c may prevent the active layer 126 from being damaged by absorbing laser light emitted to the semiconductor structure 120 during a laser lift-off (LLO) process of removing a grown substrate. Therefore, the semiconductor device according to the embodiment may prevent damage to the active layer 126 during the LLO process, thereby improving optical and electrical characteristics.

A thickness of the intermediate layer 124c and the aluminum composition therein may be appropriately adjusted to absorb laser light emitted to the semiconductor structure 120 during the LLO process. Therefore, the aluminum composition in the intermediate layer 124c may correspond to a wavelength of laser light used in the LLO process. When the wavelength of the laser light used in the LLO process is in a range of 200 nm to 300 nm, the aluminum composition in the intermediate layer 124c may be in a range of 30% to 60% and the thickness thereof may be in a range of 1 nm to 10 nm.

For example, when the wavelength of the laser light used in the LLO process is lower than 270 nm, the aluminum composition in the intermediate layer 124c may be increased to 50% to 70%. When the aluminum composition in the intermediate layer 124c is higher than that of a well layer 126a, the intermediate layer 124c may not absorb light emitted from the active layer 126. Therefore, light extraction efficiency may be improved.

A control layer 124d may be disposed between the first-second conductive semiconductor layer 124b and the active layer 126. The control layer 124d may decrease the intensity of first carrier energy injected from the first conductive semiconductor layer 124 toward the active layer to adjust balance of the concentrations or densities of a first carrier and a second carrier. Therefore, luminous efficiency may be improved to improve light output characteristics of the semiconductor device. The aluminum composition in the control layer 124d may be higher than aluminum compositions of the first conductive semiconductor layer 124, the active layer 126, and the second conductive semiconductor layer 127.

The active layer 126 may be disposed between the first conductive semiconductor layer 124 and a second conductive semiconductor layer 127. The active layer 126 is a layer at which electrons (or holes) injected via the first conductive semiconductor layer 121 and holes (or electrons) injected via the second conductive semiconductor layer 123 meet. The active layer 126 may change to a low energy level and generate light having an ultraviolet wavelength as the electrons and the holes are recombined.

The active layer 122 may have, but is not limited to, a single well structure, a multi-well structure, a single quantum well structure, a multi-quantum well (MQW) structure, a quantum dot structure, or a proton beam structure.

The active layer 126 may include a plurality of well layers 126a and a plurality of barrier layers 126b. The well layer 126a and the barrier layer 126b may have an empirical formula of $In_{x2}Al_{y2}Ga_{1-x2-y2}N$ (here, $0 \leq x2 \leq 1$, $0 < y2 \leq 1$, $0 \leq x2+y2 \leq 1$). The aluminum composition in the well layer 126a may vary according to a wavelength of emitted light.

The second conductive semiconductor layer 127 may be provided on the active layer 126, embodied as a Group III-V or II-VI compound semiconductor, and doped with a second dopant.

The second conductive semiconductor layer 127 may be formed of a semiconductor material having an empirical formula of $In_{x5}Al_{y2}Ga_{1-x5-y2}N$ (here, $0 \leq x5 \leq 1$, $0 < y2 \leq 1$, $0 \leq x5+y2 \leq 1$) or a material selected from among AlGaN, AlInN, AlN, AlGaAs, and AlGaInP.

When the second dopant is a p-type dopant such as Mg, Zn, Ca, Sr, or Ba, the second conductive semiconductor layer 127 doped with the second dopant may be a p-type semiconductor layer.

An electron blocking layer 129 may be provided between the active layer 126 and the second conductive semiconductor layer 127. The electron blocking layer 129 may block the flow of carriers supplied from the first conductive semiconductor layer 124 to the second conductive semiconductor layer 127, thereby increasing a probability of recombination of electrons and holes in the active layer 126.

An energy bandgap of the electron blocking layer 129 may be greater than that of the active layer 126 and/or the second conductive semiconductor layer 127. The electron blocking layer 129 is doped with the second dopant and thus may be defined as a region of the second conductive semiconductor layer 127.

The electron blocking layer 129 may be selected from among semiconductor materials having an empirical formula of $In_{x1}Al_{y1}Ga_{1-x1-y1}N$ (here, $0 \leq x1 \leq 1$, $0 \leq y1 \leq 1$, $0 \leq x1+y1 \leq 1$), e.g., AlGaN, AlN, and InAlGaN.

In one embodiment, all of the first conductive semiconductor layer 124, the active layer 126, the electron blocking layer 129, the second conductive semiconductor layer 127, and a third conductive semiconductor layer 128 may include aluminum. Accordingly, the first conductive semiconductor layer 124, the active layer 126, the electron blocking layer 129, the second conductive semiconductor layer 127, and the third conductive semiconductor layer 128 may include an AlGaN, InAlGaN, or AlN composition.

The aluminum composition in the electron blocking layer 129 may be in a range of 50% to 100%. When aluminum composition in the electron blocking layer 129 is less than 50%, the electron blocking layer 129 may have a sufficient energy barrier to block the movement of carriers and may not absorb light emitted from the active layer 126.

The electron blocking layer 129 may include a first blocking section 129a and a second blocking section 129b. The aluminum composition in the first blocking section 129a may increase in a direction from the first conductive semiconductor layer 124 toward the second conductive semiconductor layer 127.

The aluminum composition in the first blocking section 129a may be in a range of 80% to 100%. Therefore, the aluminum composition in the first blocking section 129a of the electron blocking layer 129 may be highest in the semiconductor structure 120. The first blocking section 129a may be AlGaN or AlN. Alternatively, the first blocking section 129a may be a superlattice layer in which AlGaN and AlN are alternately arranged.

The first blocking section 129a may have a thickness of about 0.1 nm to 4 nm. To effectively block the movement of carriers (e.g., electrons), the thickness of the first blocking section 129a may be set to 0.1 nm or more. To secure injection efficiency of carriers (e.g., holes) from the second conductive semiconductor layer 127 to the active layer 126, the thickness of the first blocking section 129a may be set to 4 nm or less.

A third blocking section 129c between the first blocking section 129a and the second blocking section 129b may include an undoped section that does not include a dopant. Therefore, the third blocking section 129c may prevent diffusion of a dopant from the second conductive semiconductor layer 127 to the active layer 126.

The second conductive semiconductor layer 127 may include a second-first conductive semiconductor layer 127a and a second-second conductive semiconductor layer 127b.

A thickness of the second-first conductive semiconductor layer 127a may be greater than 10 nm and less than 50 nm. For example, the second-first conductive semiconductor layer 127a may have a thickness of 25 nm. When the thickness of the second-first conductive semiconductor layer 127a is greater than 10 nm, a resistance in a horizontal direction decreases and thus current diffusion efficiency may be improved. When the thickness of the second-first conductive semiconductor layer 127a is less than 50 nm, a path in which light incident on the second-first conductive semiconductor layer 127a from the active layer 126 is absorbed may decrease and light extraction efficiency of the semiconductor device may be improved.

The aluminum composition in the second-first conductive semiconductor layer 127a may be higher than that of in the well layer 126a. The aluminum composition in the well layer 126a may be in a range of about 20% to 60% to generate deep-ultraviolet light or far-ultraviolet light. Therefore, the aluminum composition in the second-first conductive semiconductor layer 127a may be greater than 40% and less than 80%. For example, when the aluminum composition in the well layer 126a is 30%, the aluminum composition in the second-first conductive semiconductor layer 127a may be 40%.

When the aluminum composition in the second-first conductive semiconductor layer 127a is lower than that of the well layer 126a, a probability that ultraviolet rays are absorbed by the second-first conductive semiconductor layer 127a is high and thus light extraction efficiency may decrease.

The second-second conductive semiconductor layer 127b has a relatively uniform aluminum composition and thus the hole injection efficiency or crystallinity of the semiconductor structure 120 may be improved. The thickness of the second-second conductive semiconductor layer 127b may be in a range of 20 nm to 60 nm. The aluminum composition in the second-second conductive semiconductor layer 127b may be in a range of 40% to 80%.

The third conductive semiconductor layer 128 may be provided on the second conductive semiconductor layer 127.

The third conductive semiconductor layer 128 may be a surface region of the semiconductor structure 120 in contact with a second electrode. A current may be injected into the third conductive semiconductor layer 128 through the second electrode, and current injection efficiency may be controlled by a resistance between the third conductive semiconductor layer 128 and the second electrode. The resistance between the third conductive semiconductor layer 128 and the second electrode may be caused by one or more actions such as an ohmic contact, a Schottky contact, or a tunnel effect but is not limited thereto.

The third conductive semiconductor layer 128 may be a Group III-V compound semiconductor or a Group II-VI compound semiconductor and may be doped with the first dopant. The third conductive semiconductor layer 128 may be selected from among semiconductor materials having an empirical formula of $In_{x1}Al_{y1}Ga_{1-x1-y1}N$ (here, $0 \leq x1 \leq 1$, $0 < y1 \leq 1$, $0 \leq x1+y1 \leq 1$), e.g., AlGaN, InAlGaN, and AN. The first dopant may be an n-type dopant such as Si, Ge, Sn, Se, or Te. That is, the third conductive semiconductor layer 128 may be the same n-type semiconductor layer as the first conductive semiconductor layer 124.

The third conductive semiconductor layer 128 may include both the first dopant and the second dopant. The first dopant of the third conductive semiconductor layer 128 may be intentionally doped but the second dopant thereof may be a result of diffusing the second dopant doped onto the second conductive semiconductor layer 127. However, embodiments are not limited thereto, and both the first dopant and the second dopant may be intentionally doped on the third conductive semiconductor layer 128 to activate holes.

Even when the third conductive semiconductor layer 128 is doped only with the first dopant, a doping concentration of the second dopant may be higher than that of the first dopant due to a memory effect.

In this case, a concentration ratio between the first dopant and the second dopant which are doped on the third conductive semiconductor layer 128 may be 0.01:1.0 or 0.8:1.0. When the concentration ratio is greater than 0.01:1.0, the concentration of the first dopant increases and thus the ohmic resistance may decrease due to a tunnel effect. The third conductive semiconductor layer 128 is a very thin film and thus is difficult to dope such that the concentration ratio is greater than 0.8:1.0.

For example, the concentration of the first dopant of the third conductive semiconductor layer 128 may be $1 \times 10^{18}$ cm-3 or $2 \times 10^{20}$ cm-3. The concentration of the second dopant of the third conductive semiconductor layer 128 may be $1 \times 10^{19}$ cm-3 or $2 \times 10^{21}$ cm-3.

In this case, the concentration of the first dopant of the third conductive semiconductor layer 128 may be equal to or higher than that of the first dopant of the first conductive semiconductor layer 124 and that of the first dopant on the barrier layer 126b.

The third conductive semiconductor layer 128 may have a thickness of 1 nm to 10 nm. When the thickness of the third conductive semiconductor layer 128 is greater than 10 nm, hole injection efficiency may decrease. Therefore, the thickness of the third conductive semiconductor layer 128 may be less than those of the first conductive semiconductor layer 124 and the second conductive semiconductor layer 127.

In one embodiment, the hole injection efficiency of third conductive semiconductor layer 128 may improve due to the tunnel effect and thus the aluminum composition therein may be controlled to be higher than that of the well layer 126a.

The aluminum composition in the third conductive semiconductor layer 128 may be in a range of 20% to 70%. When the aluminum composition is 20% or more, the difference in aluminum composition between the third conductive semiconductor layer 128 and the well layer 126a may decrease, thereby improving light absorption. When the aluminum composition is 70% or less, an operating voltage may increase and thus the light output may be improved.

In one embodiment, the aluminum composition in the second conductive semiconductor layer 127 may be uniform in the second-second conductive semiconductor layer 127b in a direction away from the active layer 126 and may gradually decrease in the second-first conductive semiconductor layer 127a. The aluminum composition in the third conductive semiconductor layer 128 may also decrease in a thickness direction.

A degree of reduction of the aluminum composition in the second-first conductive semiconductor layer 127a may be different from or the same as that of the aluminum composition in the third conductive semiconductor layer 128. However, embodiments are not limited thereto and the aluminum composition in the third conductive semiconductor layer 128 may be uniform.

In one embodiment, an aluminum composition P3 in the third conductive semiconductor layer 128 may be less than an aluminum composition P10 in the well layer and an aluminum composition P4 in the intermediate layer. In this case, an ohmic resistance with the second electrode may be effectively lowered. However, embodiments are not limited thereto, and an aluminum composition in the third conductive semiconductor layer 128 may be variously changed as described below.

FIG. 2B illustrates SIMS data of a semiconductor structure according to a first embodiment of the present invention. FIG. 2C is a graph showing the strength of aluminum ions.

Referring to FIGS. 2B and 2C, in the semiconductor structure, the compositions of aluminum (Al), gallium (Ga), a first dopant, and a second dopant may change in a direction from a first conductive semiconductor layer 124 to a second conductive semiconductor layer 127. The first dopant may be silicon (Si) and the second dopant may be magnesium (Mg), but they are not limited thereto.

The SIMS data may be analysis data obtained by Time-of-Flight Secondary Ion Mass Spectrometry (TOF-SIMS).

SIMS data may be an analysis result obtained by counting the number of secondary ions released when primary ions are emitted to a surface of a target. In this case, the primary ions may be selected from O2+, Cs+, Bi+, etc., an acceleration voltage may be adjusted to be in a range of 20 to 30 keV, a current to be emitted may be adjusted to be in a range of 0.1 pA to 5.0 pA, and an area of the target to which current is to be emitted may be 20 nm×20 nm.

The SIMS data may be obtained by collecting secondary ion mass spectrums while gradually etching a surface S0 (a point having a depth of zero) of the second conductive semiconductor layer 127 toward the first conductive semiconductor layer 124. The secondary ions may be components of a semiconductor layer. For example, the secondary ions may be aluminum, gallium, a first dopant, or a second dopant but is not limited thereto.

However, embodiments are not limited thereto, and measurement conditions for detecting AlGaN-based and/or GaN-based semiconductor materials and first and second dopant materials may be variously used.

A result of a SIMS analysis may be interpreted using a spectrum of the intensity or doping concentration of the secondary ions, in which generated noise, the intensity or concentration of which is 0.9 to 1.1 times the intensity or doping concentration of the secondary ions, may be considered in the interpretation of the intensity or doping concentration of the secondary ions. Thus, the term "equal/same" may be understood to include noise, the intensity of which is 0.9 to 1.1 times the intensity or doping concentration of a specific secondary ion. The doping concentration of and the intensity of the secondary ions at each point may refer to a highest point of noise that is increasing or decreasing.

In the SIMS data of FIG. 2B, aluminum represents spectral data of the intensity of the secondary ions, and the first dopant and the second dopant are data obtained by measuring doping concentrations. That is, FIG. 2B is a graph showing the SIMS data and doping concentration data in one drawing.

Although FIG. 2B illustrates that parts of the spectrum of the intensity of aluminum ions and the spectrums of the concentrations of the first and second dopants cross one another, data of the intensity of aluminum ions and the concentrations of the first and second dopants may be in an independent relationship with one another.

Although it is illustrated as an example that the spectrum of the intensity of aluminum ions and the spectrum of the doping concentration of the second dopant cross each other near the surface S0, the graph of doping concentration on the data may decrease when a reference point (a lowest point on a Y-axis of a left part of the drawing) of the doping concentration is set to be low. For example, when a reference point of the doping concentration of the second dopant is reduced from 1.00E+14 to 1.00E+12, the graph of the concentration of the second dopant decreases in the drawing and thus data of the second dopant and data of aluminum may not cross each other.

A method of measuring the concentrations of the first dopant and the second dopant is not particularly limited. In addition, in the present embodiment, a vertical axis (the Y-axis) is illustrated by converting it into a logarithmic scale.

It can be seen that the intensity of aluminum ions gradually increases as a depth in a surface thereof increases and then repeatedly increases and decreases after a highest intensity point. In a GaN-based semiconductor material, an Al atom replaces a Ga atom to form an AlGaN material and thus, although not shown, the intensity of gallium ions may be symmetrical to that of aluminum ions.

In one embodiment, the intensity of ions may increase or decrease according to measurement conditions. However, a graph of the intensity of secondary ions (aluminum ions) may increase when the intensity of primary ions increases and decrease when the intensity of primary ions decreases when taken as a whole. Therefore, a change in the intensity of ions in a thickness direction may be similar even when the measurement conditions are changed.

The intensity of aluminum ions at a first point P1 may be highest in the semiconductor structure 120. At the first point P1, the intensity of aluminum ions is highest and thus non-luminescent recombination of a first carrier with a second carrier in a second conductive semiconductor layer may be prevented. Therefore, a light output of the semiconductor device may be improved. The first point P1 may be a region corresponding to a first-first section 129a of a blocking layer 129 but is not limited thereto.

The intensity of secondary ions at a second point P2 may be a point at which the intensity of aluminum ions is highest among points on the intensity of aluminum ions which extend from the first point P1 in a first direction D2.

The second point P2 may be a point at which the intensity of aluminum ions in the first conductive semiconductor layer 124 is highest and be closest to the active layer 126 in the first conductive semiconductor layer 124.

The second point P2 may be the control layer of FIG. 2A. However, embodiments are not limited thereto and the second point P2 may be a point between the first conductive semiconductor layer 124 and the active layer 126.

The intensity of third ions at a third point P3 may be a point at which the intensity of aluminum ions is lowest in a direction D1 from the first point P1 toward the surface of the semiconductor structure 120. The third point P3 may refer to the intensity of ions at the surface of the semiconductor structure. In one embodiment, an AlGaN composition may be formed on the surface of the semiconductor structure and thus extraction efficiency of ultraviolet light may be improved.

The intensity of fourth ions at a fourth point P4 may be a point at which the intensity of aluminum ions is lowest in the first direction D2 from the second point P2. The fourth point P4 may absorb laser light not to penetrate into an active layer to prevent damage to the active layer when a Laser Lift-Off process (hereinafter referred to as LLO) process is applied during a semiconductor device process.

In addition, when a first electrode is in contact with the fourth point P4, a resistance between the first electrode and the fourth point P4 may be decreased to improve the efficiency of injecting a current into the semiconductor structure. From this point of view, the intensity of aluminum ions at the fourth point P4 may be lowest in the first direction D2 from the second point P2.

A fifth point P5 may be located between the second point P2 and the fourth point P4. The intensity of aluminum ions at the fifth point P5 may be an intensity of ions between those of the second point P2 and the fourth point P4. The fifth point P5 may be one specific point and may constitute one layer. A current injected through the fourth point P4 may be uniformly distributed in a layer including the fifth point P5 so that the density of the current injected into the active layer per area may be improved to be uniform.

A tenth point P10 may be located between the first point P1 and the third point P3 and have the intensity of aluminum ions that is the same as a point having the smallest intensity of ions between the first point P1 and the second point P2. That is, the tenth point P10 may have the same intensity of ions as a well layer.

An eleventh point P11 may be spaced apart from the fourth point P4 in the first direction D2. In addition, a twelfth section P12 and a thirteenth section P13 in which aluminum ions increase in the first direction D2 may be provided. In this case, the first dopant may not be doped in the thirteenth section P13.

Referring to FIGS. 2A and 2C, a doping curve of the first dopant (e.g., Si) may be uniform in a first section S1 in which a first conductive semiconductor layer is provided. In this case, a second section S2 having a relatively low doping concentration may be located in the first section S1 of the first conductive semiconductor layer. A second section S2 may be formed as a doping concentration of the first dopant changes due to a change of growth conditions when a composition changes in a direction from a first-first conductive semiconductor layer to an intermediate layer. The second section S2 may be a point corresponding to the fourth point P4 of the intensity of aluminum ions.

A doping curve of the first dopant (e.g., Si) may have a third section S3 in which a doping concentration decreases between the first conductive semiconductor layer and the active layer. The third section S3 may be an undoped layer which is not doped with the first dopant. The third section S3 is doped with a relatively small amount of the first dopant and thus may disperse a current due to a high resistance thereof.

The doping curve of the first dopant (e.g., Si) may include a fourth section S4 in which a concentration increases or decreases in the active layer. In the fourth section S4, a barrier layer of the active layer may be doped with the first dopant. Therefore, the efficiency of injecting the first carrier into the active layer may be improved and the efficiency of luminous recombination of the first carrier and the second carrier in the active layer may be improved. In addition, an operating voltage Vf may decrease. A peak of the first dopant in the fourth section S4 may correspond to a peak P61 of the active layer. The intensity of the peak P61 of the active layer may be lower than that of a valley P62.

The doping curve of the first dopant may include a fifth section S5 in which a doping concentration decreases in a second conductive semiconductor layer and a sixth section S6 in which the doping concentration increases on the surface S0. In this case, it can be seen that the doping concentration on the surface S0 is similar to or higher than the doping concentration in the first section S1. Therefore, in the semiconductor structure according to the embodiment, it can be seen that a surface layer on which the second electrode is disposed is formed of n-AlGaN.

A doping concentration of the second dopant (e.g., Mg) may be highest at the surface S0 and gradually decrease in a direction away from the surface S0. It can be seen that the doping concentration of the second dopant (e.g., Mg) on the surface S0 of the semiconductor structure is higher than that of the first dopant (e.g., Si). This may be because the doping concentration of the second dopant increases due to a memory effect although the surface of the semiconductor structure is not doped with the second dopant.

The doping concentration of the second dopant increases toward the surface S0 but the second dopant includes a section (a section between points M2 and M3) in which a doping concentration decreases toward the surface S0. Due to this inversion section, the concentration of the second dopant decreases and thus a resistance increases, thereby improving hole dispersion efficiency.

The second dopant may be present in all regions of the second conductive semiconductor layer and a part of the active layer but is not limited thereto. The second dopant may be provided only in the second conductive semiconductor layer but may diffuse to the active layer. Therefore, the efficiency of injecting the second dopant into the active layer may be improved. However, when the second dopant is diffused to the first conductive semiconductor layer, a leakage current of the semiconductor device and/or non-luminescent recombination of the first and second carriers may occur, thereby reducing reliability and/or luminous efficiency of the semiconductor device.

FIG. 3 is a graph showing an aluminum composition ratio of a semiconductor structure according to a second embodiment of the present invention. FIG. 4 is a graph showing an aluminum composition ratio of a semiconductor structure according to a third embodiment of the present invention. FIG. 5 is a graph showing an aluminum composition ratio of a semiconductor structure according to a fourth embodiment of the present invention.

Referring to FIG. 3, an aluminum composition P3 in a third conductive semiconductor layer 128 is higher than an aluminum composition P1 in a well layer 126a and lower than an aluminum composition P4 in an intermediate layer 124c. The aluminum composition P1 in the well layer 126a may be controlled according to a wavelength of light to be generated. For example, an aluminum composition for generating UVB wavelength may be in a range of 20% to 30%, and an aluminum composition for generating UVC wavelength may be in a range of 30% to 50%. In this case, when the aluminum composition P3 in the third conductive semiconductor layer 128 is controlled to be higher than the aluminum composition P1 in the well layer 126a, a light absorption characteristic of the third conductive semiconductor layer 128 may be improved.

The aluminum composition P4 in the intermediate layer 124c may be in a range of 50% to 70%. Therefore, when the aluminum composition P3 in the third conductive semiconductor layer 128 is set to be lower than the aluminum composition P4 in the intermediate layer 124c, an excessive increase of an operation voltage may be prevented.

In one embodiment, hole injection efficiency is improved even when an aluminum composition increases due to the tunnel effect, and thus, a light absorption rate may be improved by increasing the aluminum composition P3 in the third conductive semiconductor layer 128 to be higher than the aluminum composition P1 in the well layer 126a.

It may be preferable that an aluminum composition in the third conductive semiconductor layer 128 be lower in terms of ohmic characteristics and be higher in terms of light absorption. Accordingly, the aluminum composition P3 in the third conductive semiconductor layer 128 may be controlled to be higher than the aluminum composition P1 in the well layer and be lower than the aluminum composition P4 in a second conductive semiconductor layer 127 or the intermediate layer 124c. In this case, a second-first conductive semiconductor layer 127a may have a slope such that the aluminum composition continuously changes.

Referring to FIG. 4, the aluminum composition P3 in the third conductive semiconductor layer 128 and the aluminum composition P4 in the second conductive semiconductor layer 127 may change intermittently. When the difference between the aluminum composition P4 in the second conductive semiconductor layer 127 and the aluminum composition P3 in the third conductive semiconductor layer 128 is small, the third conductive semiconductor layer 128 may be formed without reducing an aluminum composition.

Referring to FIG. 5, a second conductive semiconductor layer 127 and a third conductive semiconductor layer 128 may be the same in terms of an aluminum composition. As described above, hole injection efficiency of the third conductive semiconductor layer 128 may be improved due to the tunnel effect even when the aluminum composition increases. Accordingly, it may be preferable that the second conductive semiconductor layer 127 and the third conductive semiconductor layer 128 be controlled to have the same aluminum composition in terms of light extraction.

In this case, in order to achieve an appropriate ohmic resistance, a doping concentration of a dopant may be maximized and a thickness of the third conductive semiconductor layer 128 may be minimized.

FIG. 6 is a conceptual diagram of a semiconductor device according to an embodiment of the present invention. FIGS. 7A and 7B are diagrams for describing a configuration in which the light output is improved according to the number of recesses. FIG. 8 is an enlarged view of part A of FIG. 6.

Referring to FIG. 6, the semiconductor device according to the embodiment includes a semiconductor structure 120, which includes a first conductive semiconductor layer 124, a second conductive semiconductor layer 127, and an active layer 126, a first electrode 142 electrically connected to the first conductive semiconductor layer 124, and a second electrode 146 electrically connected to the second conductive semiconductor layer 127.

The first conductive semiconductor layer 124, the active layer 126, and the second conductive semiconductor layer 127 may be disposed in a first direction (a Y-axis direction). Hereinafter, the first direction (Y-axis direction), which is a thickness direction of each layer, will be defined as a vertical direction, and a second direction (X-axis direction) perpendicular to the first direction (Y-axis direction) will be defined as a horizontal direction.

All of the above-described structures may apply to the semiconductor structure 120 according to the embodiment. The semiconductor structure 120 may include a plurality of recesses R1 passing through the second conductive semiconductor layer 127 and the active layer 126 and may extend to a partial region of the first conductive semiconductor layer 124.

The first electrode 142 may be disposed on an upper surface of the recess R1 to be electrically connected to the first conductive semiconductor layer 124. The second electrode 146 may be disposed under the second conductive semiconductor layer 127.

The first electrode 142 and the second electrode 146 may be ohmic electrodes. The first electrode 142 and the second electrode 146 may be formed of, but are not limited to, at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf. For example, the first electrode 142 may include a plurality of metal layers (e.g., Cr/Al/Ni), and the second electrode 146 may be ITO.

Referring to FIG. 7A, when a GaN-based semiconductor structure 120 emits ultraviolet rays, the semiconductor structure 120 may include aluminum, and when an aluminum composition of the semiconductor structure 120 is increased, current dispersion characteristics in the semiconductor structure 120 may be degraded. When the active layer 126 includes Al and emits ultraviolet rays, the amount of light emitting from side surfaces of the active layer 126 is higher than that in a GaN-based blue-light-emitting element (TM mode). The TM mode may occur mainly in an ultraviolet semiconductor device.

Current dispersion characteristics of the ultraviolet semiconductor device are lowered when compared to those of a blue GaN-based semiconductor device. Therefore, it is necessary to arrange a larger number of first electrodes 142 in the ultraviolet semiconductor device than in the GaN-based blue-light-emitting semiconductor device.

When an aluminum composition is increased, current dispersion characteristics may be degraded. Referring to FIG. 7A, a current is dispersed only to points near the first electrodes 142 and a current density may rapidly decrease at points distant from the first electrodes 142. Therefore, an effective light-emitting region P2 may decrease in size.

The effective light-emitting region P2 may be defined as a region ranging to a boundary point at which current density is 40% or less with respect to a current density at the center of the first electrode 142 having highest current density. For example, the effective light-emitting region P2 may be adjusted according to a level of an injected current and the composition of aluminum within a range of 40 μm from the center of the recess R1.

A low current density region P3 has low current density and thus the amount of light emitted therefrom may be less than that emitted from the effective light emission region P2. Accordingly, the light output may be improved by further arranging a first electrode 142 in the low current density region P3 having low current density or using a reflective structure.

In general, current dispersion characteristics of a GaN-based semiconductor device that emits blue light are relatively good and thus areas of the recess R1 and the first electrode 142 are preferably minimized. This is because the area of the active layer 126 decreases as the areas of the recess R1 and the first electrode 142 increase. However, in one embodiment, the composition of aluminum is high and thus current dispersion characteristics are relatively poor, and thus, even when the area of the active layer 126 is sacrificed, it may be desirable to reduce the low current density area P3 in size by increasing the area and/or number of the first electrodes 142 or to dispose a reflective structure in the low current density region P3.

Referring to FIG. 7B, when the number of recesses R1 is increased to 48, the recesses R1 may not be arranged in a straight line in horizontal and vertical directions but may be arranged in a zigzag manner. In this case, the area of the low current density region P3 may be reduced and thus most of the active layer 126 may participate in light emission.

In an ultraviolet light-emitting element, current dispersion characteristics may be degraded in the semiconductor structure 120, and thus, it is necessary to smoothly inject a current so as to secure uniform current density characteristics in the semiconductor structure 120, thereby achieving electrical and optical characteristics and reliability of the semiconductor device. Therefore, for smooth current injection, a relatively large number of recesses R1 may be formed to arrange the first electrodes 142 as compared to a general GaN-based semiconductor structure 120.

Referring to FIG. 8, a first insulating layer 131 may electrically insulate the first electrode 142 from the active layer 126 and the second conductive semiconductor layer 127. In addition, the first insulating layer 131 may electrically insulate the second electrode 146 and a second conductive layer 150 from a first conductive layer 165. In addition, the first insulating layer 131 may prevent side surfaces of the active layer 126 from being oxidized during a process of the semiconductor device.

The first insulating layer 131 may be formed of, but is not limited to, at least one material selected from the group consisting of SiO2, SixOy, Si3N4, SixNy, SiOxNy, Al2O3, TiO2, AlN, etc. The first insulating layer 131 may be formed in a single layer or multiple layers. For example, the first insulating layer 131 may be a distributed Bragg reflector (DBR) having a multilayer structure including Si oxide or a Ti compound. However, embodiments are not limited thereto and the first insulating layer 131 may include various types of reflective structures.

When the first insulating layer 131 performs a reflective function, light extraction efficiency may be improved by reflecting light L1, which is emitted from the active layer 126 toward a side surface of the first insulating layer 131, in an upward direction. In this case, as the number of recesses R1 increases, the light extraction efficiency may be more effective.

A diameter W3 of the first electrode 142 may be in a range of 24 μm to 50 μm. When this range is satisfied, current dispersion may be easily performed and a large number of first electrodes 142 may be disposed. When the diameter W3 of the first electrode 142 is greater than 24 μm, the amount of current injected into the first conductive semiconductor layer 124 may be sufficiently secured. When the diameter W3 of the first electrode 142 is 50 μm or less, a sufficient number of first electrodes 142 may be disposed in the area of the first conductive semiconductor layer 124 and current dispersion characteristics may be secured.

A diameter W1 of the recess R1 may be in a range of 38 μm to 60 μm. The diameter W1 of the recess R1 may be defined as a largest area of the recess R1 when disposed under the second conductive semiconductor layer 127. The diameter W1 of the recess R1 may be a diameter of the recess R1 disposed on a bottom surface of the second conductive semiconductor layer 127.

When the diameter W1 of the recess R1 is 38 μm or more, in order to form the first electrode 142 in the recess R1, a process margin for securing an area for electrically connection of the first electrode 142 with the first conductive semiconductor layer 124 may be secured. When the diameter W1 of the recess R1 is 60 μm or less, a reduction of the volume of the active layer 126 when the first electrode 142 is disposed may be prevented and thus luminous efficiency may be degraded.

An inclination angle θ5 of the recess R1 may be in a range of 70 to 90 degrees. When the area range is satisfied, it may be advantageous to form the first electrode 142 on an upper surface of the recess R1 and a large number of recesses R1 may be formed.

When the inclination angle θ5 is less than 70 degrees, the area of the active layer 126 to be removed may increase but an area in which the first electrode 142 is disposed may decrease. Therefore, a current injection characteristic may decrease and luminous efficiency may decrease. Therefore, a ratio between the areas of the first electrode 142 and the second electrode 146 may be adjusted using the inclination angle θ5 of the recess R1.

A thickness of the second electrode 146 may be less than that of the first insulating layer 131. Therefore, step coverage characteristics of the second conductive layer 150 covering the second electrode 146 and a second insulating layer 132 may be secured, and reliability of the semiconductor device may be improved. The second electrode 146 may be spaced a first distance S1 of 1 μm to 4 μm from the first insulating layer 131. When the first distance S1 is 1 μm or more, a process margin for a process of arranging the second electrode 146 on a region of the first insulating layer 131 may be secured and thus electrical characteristics, optical characteristics, and reliability of the semiconductor device may be improved. When the first distance S1 is 4 μm or less, the entire area in which the second electrode 146 may be disposed may be secured and an operating voltage characteristic of the semiconductor device may be improved.

The second conductive layer 150 may cover the second electrode 146. Accordingly, a second electrode pad 166, the second conductive layer 150, and the second electrode 146 may form one electrical channel.

The second conductive layer 150 may be in contact with side surfaces and an upper surface of the first insulating layer 131 while completely surrounding the second electrode 146. The second conductive layer 150 may be formed of a material having good adhesion with the first insulating layer 131, include at least one material selected from the group consisting of materials, such as Cr, Al, Ti, Ni, Au, etc. and an alloy thereof, and be formed in a single layer or a multilayer.

When the second conductive layer 150 is in contact with the side surfaces and the upper surface of the first insulating layer 131, thermal and electrical reliability of the second electrode 146 may be improved. In addition, the second conductive layer 150 may have a reflective function of reflecting light emitted between the first insulating layer 131 and the second electrode 146 in an upward direction.

The second conductive layer 150 may be disposed within the first distance S1 between the first insulating layer 131 and the second electrode 146. The second conductive layer 150 may be in contact with the side surfaces and the upper surface of the second electrode 146 and the side surfaces and the upper surface of the first insulating layer 131 within the first distance S1. In addition, a region in which a Schottky junction is formed due to a contact between the second conductive layer 150 and the second conductive semiconductor layer 127 may be provided within the first distance S1, and current dissipation may be facilitated due to the Schottky junction. However, embodiments are not limited thereto, and this region may be freely located, provided that a resistance between the second conductive layer 150 and the second conductive semiconductor layer 127 is higher than a resistance between the second electrode 146 and the second conductive semiconductor layer 127.

The second insulating layer 132 may electrically insulate the second electrode 146 and the second conductive layer 150 from the first conductive layer 165. The first conductive layer 165 may pass through the second insulating layer 132 to be electrically connected to the first electrode 142. The second insulating layer 132 and the first insulating layer 131 may be formed of the same material or different materials.

Referring back to FIG. 6, the second conductive layer 150 may electrically connect the second electrode 146 and the second electrode pad 166.

The second electrode 146 may be directly disposed on the second conductive semiconductor layer 127. When the second conductive semiconductor layer 127 is formed of AlGaN, hole injection may not be smoothly performed due to low electrical conductivity. Therefore, it is necessary to appropriately adjust an Al composition of the second conductive semiconductor layer 127. This will be described below.

The second conductive layer 150 may be formed of at least one material selected from the group consisting of materials, such as Cr, Al, Ti, Ni, Au, etc. and an alloy thereof, and may be formed in a single layer or a multilayer.

The first conductive layer 165 and a bonding layer 160 may be disposed along the bottom surface of the semiconductor structure 120 and a shape of the recesses R1. The first conductive layer 165 may be formed of a material having high reflectivity. For example, the first conductive layer 165 may include aluminum. When the electrode layer 165 includes aluminum, the first conductive layer 165 may reflect light, which is emitted from the active layer 126 toward a substrate 170, in an upward direction, thereby improving light extraction efficiency. However, embodiments are not limited thereto, and the first conductive layer 165 may provide a function of electrically connection to the first electrode 142. The first conductive layer 165 may be disposed without including a material having high reflectivity, e.g., aluminum and/or silver (Ag). In this case, in the recesses R1, a reflective metal layer (not shown) formed of a material having high reflectivity may be disposed between the first electrode 142 and the first conductive layer 165 and between the second conductive semiconductor layer 127 and the first conductive layer 165.

The bonding layer 160 may include a conductive material. For example, the bonding layer 160 may include a material selected from the group consisting of gold, tin, indium, aluminum, silicon, silver, nickel, and copper or an alloy thereof.

The substrate 170 may be formed of a conductive material. For example, the substrate 170 may include a metal or semiconductor material. The substrate 170 may be a metal having high electrical conductivity and/or high thermal conductivity. In this case, heat generated during an operation of the semiconductor device may be quickly discharged to the outside. When the substrate 170 is formed of the conductive material, the first electrode 142 may be supplied with a current from the outside through the substrate 170.

The substrate 170 may include a material selected from the group consisting of silicon, molybdenum, tungsten, copper, and aluminum or an alloy thereof.

A passivation layer 180 may be disposed on the upper and side surfaces of the semiconductor structure 120. The passivation layer 180 may have a thickness ranging from 200 nm to 500 nm. When the thickness of the passivation layer 180 is 200 nm or more, the semiconductor device may be protected from external moisture or foreign materials, thereby improving electrical and optical reliability of the semiconductor device. When the thickness of the passivation layer 180 is 500 nm or less, stress applied to the semiconductor device may decrease and problems caused by an increase in unit price of the semiconductor device may be reduced when the optical and electrical reliability of the semiconductor device are degraded or a processing time of the semiconductor device increases.

Irregularities may be formed on the upper surface of the semiconductor structure 120. The irregularities may improve extraction efficiency of light emitted from the semiconductor structure 120. An average height of the irregularities may vary according to an ultraviolet wavelength, and in the case of UV-C, the average height may be in a range of about 300 nm to 800 nm and light extraction efficiency may be improved when the average height is in a range of about 500 nm to 600 nm.

FIG. 9 is a conceptual diagram of a semiconductor device according to another embodiment of the present invention. FIG. 10 is a plan view of FIG. 9.

Referring to FIG. 9, the above-described configurations may directly apply to a semiconductor structure 120. In addition, a plurality of recesses R1 may pass through a second conductive semiconductor layer 127 and an active layer 126 and extend to a partial region of a first conductive semiconductor layer 124.

The semiconductor device may include a side reflector Z1 disposed at an edge thereof. The side reflector Z1 may be obtained by forming a second conductive layer 150, a first conductive layer 165, and a substrate 170 to protrude in a thickness direction (a Y-axis direction). Referring to FIG.

10, the side reflector Z1 is disposed along the edge of the semiconductor device to surround the semiconductor structure 120.

The second conductive layer 150 of the side reflector Z1 protrudes higher than the active layer 126 to reflect light, which is emitted from the active layer 126, upward. Therefore, light emitted in the horizontal direction (an X-axis direction) due to the TM mode may be reflected upward at an outermost angle without additionally forming a reflective layer.

An inclination angle of the side reflector Z1 may be greater than 90 degrees and less than 145 degrees. The inclination angle may be an angle formed by the second conductive layer 150 with a horizontal plane (an XZ plane). When the inclination angle is less than 90 degrees or greater than 145 degrees, the efficiency of reflecting light moving laterally in an upward direction may decrease.

FIG. 11 is a conceptual diagram of a semiconductor device package according to an embodiment of the present invention. FIG. 12 is a plan view of a semiconductor device package according to an embodiment of the present invention. FIG. 13 is a modified example of FIG. 12.

Referring to FIG. 11, the semiconductor device package may include a body 1 having a groove 3, a semiconductor device 10 disposed in the body 2, and a pair of lead frames 5a and 5b provided on the body 2 to be electrically connected to the semiconductor device 10. The semiconductor device 10 may include all the above-described configurations.

The body 2 may include a material or a coating layer that reflects ultraviolet light. The body 2 may be formed by stacking a plurality of layers 2a, 2b, 2c, 2d, and 2e. The plurality of layers 2a, 2b, 2c, 2d, and 2e may include the same material or different materials.

The groove 3 may be formed to be wider in a direction farther from the semiconductor device 10 and include a step 3a on an inclined surface thereof.

The groove 3 may be covered with a light-transmitting layer 4. The light-transmitting layer 4 is formed of a glass material but is not necessarily limited thereto. The material of the light-transmitting layer 4 is not particularly limited as long as the material is capable of effectively transmitting ultraviolet light. The inside of the groove 3 may be an empty space.

Referring to FIG. 12, the semiconductor device 10 may be disposed on the first lead frame 5a and connected to the second lead frame 5b using wires. In this case, the second lead frame 5b may be arranged to surround side surfaces of the first lead frame 5a.

Referring to FIG. 13, a plurality of semiconductor devices 10a, 10b, 10c, and 10d may be disposed on the semiconductor device package. In this case, first to fifth lead frames 5a, 5b, 5c, 5d, and 5e may be provided.

The first semiconductor device 10a may be disposed on the first lead frame 5a and connected to the second lead frame 5b using wires. The second semiconductor device 10b may be disposed on the second lead frame 5b and connected to the third lead frame 5c using wires. The third semiconductor device 10c may be disposed on the third lead frame 5c and connected to the fourth lead frame 5d using wires. The fourth semiconductor device 10d may be disposed on the fourth lead frame 5d and connected to the fifth lead frame 5e using wires.

The semiconductor devices are applicable to various types of light source devices. For example, the light source devices may be a concept including a sterilizing device, a curing device, a lighting device, a display device, a vehicle lamp, and the like. That is, the semiconductor devices are applicable to various types of electronic devices each being arranged in a case to provide light.

The sterilizing device may be provided with a semiconductor device according to an embodiment to sterilize a desired area. The sterilizing device is applicable to, but is not limited to, household appliances such as water purifiers, air conditioners, and refrigerators. That is, the sterilizing device is applicable to various products (e.g., medical devices) that are required to be sterilized.

For example, a water purifier may include a sterilizing device according to an embodiment to sterilize water to circulate. The sterilizing device may be disposed on a nozzle or a discharge port through which water circulates to emit ultraviolet rays. In this case, the sterilizing device may include a waterproof structure.

The curing device may include a semiconductor device according to an embodiment to cure various types of liquids. The liquid may be a broadest concept including all of various materials that are cured when ultraviolet light is emitted thereto. For example, the curing device may be used to cure various types of resins. Alternatively, the curing device is applicable to curing beauty products such as nail polish.

The lighting device may include a light source module, which includes a substrate and a semiconductor device according to an embodiment, a heat dissipation unit which dissipates heat from the light source module, and a power supply which processes or converts an electrical signal received from the outside and provides the resultant signal to the light source module. Furthermore, the lighting device may include a lamp, a head lamp, a street light, or the like.

The display device may include a bottom cover, a reflecting plate, a light-emitting module, a light guide plate, an optical sheet, a display panel, an image signal output circuit, and a color filter. The bottom cover, the reflecting plate, the light-emitting module, the light guide plate, and the optical sheet may constitute a backlight unit.

The reflecting plate is disposed on the bottom cover, and the light-emitting module may emit light. The light guide plate is disposed in front of the reflecting plate to guide light emitted from the light-emitting module in a forward direction, and the optical sheet may include a prism sheet and the like and be disposed in front of the light-guide plate. A display panel is disposed in front of the optical sheet, an image signal output circuit supplies an image signal to the display panel, and a color filter can be disposed in front of the display panel.

When a semiconductor device is used as a backlight unit of a display device, the semiconductor device may be used as an edge-type backlight unit or a direct-type backlight unit.

The semiconductor device may be a laser diode in addition to being the above-described light-emitting diode.

The laser diode may include a first conductive semiconductor layer, an active layer, and a second conductive semiconductor layer as described above, similar to the light-emitting element. The laser diode uses the electroluminescence phenomenon that light is emitted when a current is supplied after a p-type first conductive semiconductor and an n-type second conductive semiconductor are bonded together but is different from the light-emitting element in terms of the directivity and phase of emitted light. That is, the laser diode may emit light having one specific wavelength (monochromatic beam) to have the same phase in the same direction using the stimulated emission phenomenon and the constructive interference phenomenon. Due to the above characteristics, the laser diode is available for optical communication, medical equipment, semiconductor processing equipment, and the like.

Examples of the light-receiving element include a photodetector which is a type of transducer that detects light and converts the intensity of the light into an electric signal. Examples of the photodetector may include, but are not limited to, a photocell (silicon or selenium), a photoconductive element (cadmium sulfide or cadmium selenide), a photodiode (e.g., a photodiode with a peak wavelength in a visible blind spectral region or a true blind spectral region), a phototransistor, a photomultiplier tube, a phototube (vacuum or gas-filled), an infra-red (IR) detector, and the like.

A semiconductor device such as a photodetector may be manufactured using a direct bandgap semiconductor which generally has high photo-conversion efficiency. The photodetector may have various configurations. As photodetectors having most general configurations, there are a pin type photodetector using a p-n junction, a Schottky photodetector using a Schottky junction, a metal-semiconductor-metal (MSM) photodetector, and the like.

The photodiode may include a first conductive semiconductor layer, an active layer, and a second conductive semiconductor layer as described above, similar to the light-emitting element, and may have a p-n junction structure or a pin structure. The photodiode is operated by applying a reverse bias or a zero bias. When light is incident on the photodiode, electrons and holes are generated and thus a current flows. In this case, the intensity of the current may be substantially proportional to that of the light incident on the photodiode.

A photocell or a solar cell is a type of photodiode that converts light into a current. The solar cell may include a first conductive semiconductor layer, an active layer, and a second conductive semiconductor layer as described above, similar to the light-emitting element.

In addition, the semiconductor device is applicable as a rectifier of an electronic circuit through rectifying characteristic of a general diode using a p-n junction and applicable to an oscillation circuit or the like when applied to a super-high-frequency circuit.

The semiconductor device is not necessarily formed as a semiconductor and may further include a metal material in some cases. For example, a semiconductor device such as a light-receiving element may be formed of at least one of Ag, Al, Au, In, Ga, N, Zn, Se, P, or As, or formed of a semiconductor material doped with a p- or n-type dopant or an intrinsic semiconductor material.

While the embodiments have been particularly described above, the present invention is not limited thereto, and it will be apparent to those of ordinary skill in the art that various modifications and applications may be made without departing from the essential features of embodiments. For example, the components described in detail in the embodiments may be modified and implemented. It is to be understood that differences related to such modifications and applications fall within the scope of the present invention defined in the appended claims.

The invention claimed is:

1. A semiconductor device comprising:
    a semiconductor structure including a first conductive semiconductor layer, a second conductive semiconductor layer, and an active layer disposed between the first conductive semiconductor layer and the second conductive semiconductor layer;
    a first electrode electrically connected to the first conductive semiconductor layer; and
    a second electrode electrically connected to the second conductive semiconductor layer,
    wherein the semiconductor structure further comprises a third conductive semiconductor layer disposed between the second conductive semiconductor layer and the second electrode,
    the first conductive semiconductor layer comprises a first dopant,
    the second conductive semiconductor layer comprises a second dopant,
    the third conductive semiconductor layer comprises the first dopant and the second dopant, and
    a concentration ratio between the first dopant and the second dopant with which the third conductive semiconductor layer is doped is in a range of 0.01:1.0 to 0.8:1.0.

2. The semiconductor device of claim 1, wherein the semiconductor structure further comprises an undoped section which is located between the first conductive semiconductor layer and the active layer and is not doped with the first dopant.

3. The semiconductor device of claim 1, wherein the semiconductor structure further comprises a reversion section in which a doping concentration of the second dopant becomes smaller toward the second electrode.

4. The semiconductor device of claim 1, wherein the first conductive semiconductor layer, the active layer, the second conductive semiconductor layer, and the third conductive semiconductor layer comprise aluminum, and
    the active layer generates light in an ultraviolet wavelength range.

5. The semiconductor device of claim 4, wherein aluminum composition of the third conductive semiconductor layer is higher than or equal to aluminum compositions of well layers in the active layer, is lower than or equal to aluminum compositions of barrier layers in the active layer, and is lower than an aluminum composition of the first conductive semiconductor layer.

6. The semiconductor device of claim 4, wherein the aluminum composition of the third conductive semiconductor layer is lower than the aluminum compositions of the active layer and the first conductive semiconductor layer.

7. The semiconductor device of claim 1, wherein a concentration of the first dopant of the third conductive semiconductor layer is in a range of $1\times10^{18}$ cm$^{-3}$ to $2\times10^{20}$ cm$^{-3}$.

8. The semiconductor device of claim 7, wherein the concentration of the first dopant of the third conductive semiconductor layer is higher than a concentration of the first dopant of the first conductive semiconductor layer.

9. The semiconductor device of claim 7, wherein a concentration of the second dopant of the third conductive semiconductor layer may be in a range of $1\times10^{19}$ cm$^{-3}$ to $2\times10^{21}$ cm$^{-3}$.

10. The semiconductor device of claim 1, wherein the first conductive semiconductor layer comprises a first-first conductive semiconductor layer, a first-second conductive semiconductor layer, and an intermediate layer disposed between the first-first conductive semiconductor layer and the first-second conductive semiconductor layer,
    wherein an aluminum composition of the intermediate layer is lower than aluminum compositions of the first-first conductive semiconductor layer and the first-second conductive semiconductor layer.

11. The semiconductor device claim 10, wherein the aluminum composition of the intermediate layer is higher than an aluminum composition of a well layer of the active layer.

12. The semiconductor device of claim 11, wherein an aluminum composition of the third conductive semiconductor layer is higher than the aluminum composition of the well layer of the active layer and lower than the aluminum composition of the intermediate layer.

13. The semiconductor device of claim 1, wherein
   the semiconductor structure further comprises a plurality of recesses which pass through the third conductive semiconductor layer, the second conductive semiconductor layer, the active layer and extend to a partial region of the first conductive semiconductor layer, and
   the first electrode is disposed in the recess, and the second electrode contacts the third conductive semiconductor layer.

14. The semiconductor device of claim 13, further comprising:
   a first conductive layer electrically connected to the first electrode;
   a second conductive layer electrically connected to the second electrode;
   a second insulating layer disposed between the first conductive layer and the second conductive layer; and a conductive substrate disposed under the second conductive layer.

* * * * *